(12) United States Patent
Matsuura et al.

(10) Patent No.: US 7,078,242 B2
(45) Date of Patent: Jul. 18, 2006

(54) MANUFACTURING METHOD OF SEMICONDUCTER DEVICE

(75) Inventors: Katsuyoshi Matsuura, Kawasaki (JP); Wensheng Wang, Kawasaki (JP); Ko Nakamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/835,572

(22) Filed: Apr. 30, 2004

(65) Prior Publication Data

US 2005/0136556 A1    Jun. 23, 2005

(30) Foreign Application Priority Data

Dec. 22, 2003 (JP) ............................. 2003-425785

(51) Int. Cl.
*H01I 21/00* (2006.01)

(52) U.S. Cl. ..................... 438/3; 438/249; 438/396; 438/253; 438/240; 257/E21.001

(58) Field of Classification Search ............ 438/3, 438/240, 210, 653, 396, 253
See application file for complete search history.

(56) References Cited

U.S. PATENT DOCUMENTS 6,258,608 B1 * 7/2001 Jung .......................... 438/3
6,287,637 B1 * 9/2001 Chu et al. ................ 427/376.2
6,500,678 B1 * 12/2002 Aggarwal et al. ............ 438/3
6,649,954 B1 * 11/2003 Cross ......................... 257/295

OTHER PUBLICATIONS

Patent Abstracts of Japan, Publication No. 2002324894, dated Nov. 8, 2002.
Patent Abstracts of Japan, Publication No. 2002246564, dated Aug. 30, 2002.

* cited by examiner

*Primary Examiner*—B. William Baumeister
*Assistant Examiner*—Igwe U. Anya
(74) *Attorney, Agent, or Firm*—Westerman, Hattori, Daniels & Adrian, LLP.

(57) ABSTRACT

An $IrO_x$ film is formed as a first conductive oxide film on a PLZT film by a reactive sputtering method. Thereafter, thermal treatment by, for example, RTA is performed in an atmosphere containing oxygen having partial pressure of less than 5% of atmospheric pressure. As a result, crystallization of the PLZT film is promoted, and annealing treatment is performed for the $IrO_x$ film. Thereafter, furnace annealing at 600° C. or higher, for example, 650° C. is performed for 60 minutes in, for example, an $O_2$ atmosphere as recovering annealing to recover oxygen deficiency in the PLZT film. Subsequently, an $IrO_2$ film is formed as a second conductive oxide film on the $IrO_x$ film by a sputtering method.

16 Claims, 21 Drawing Sheets

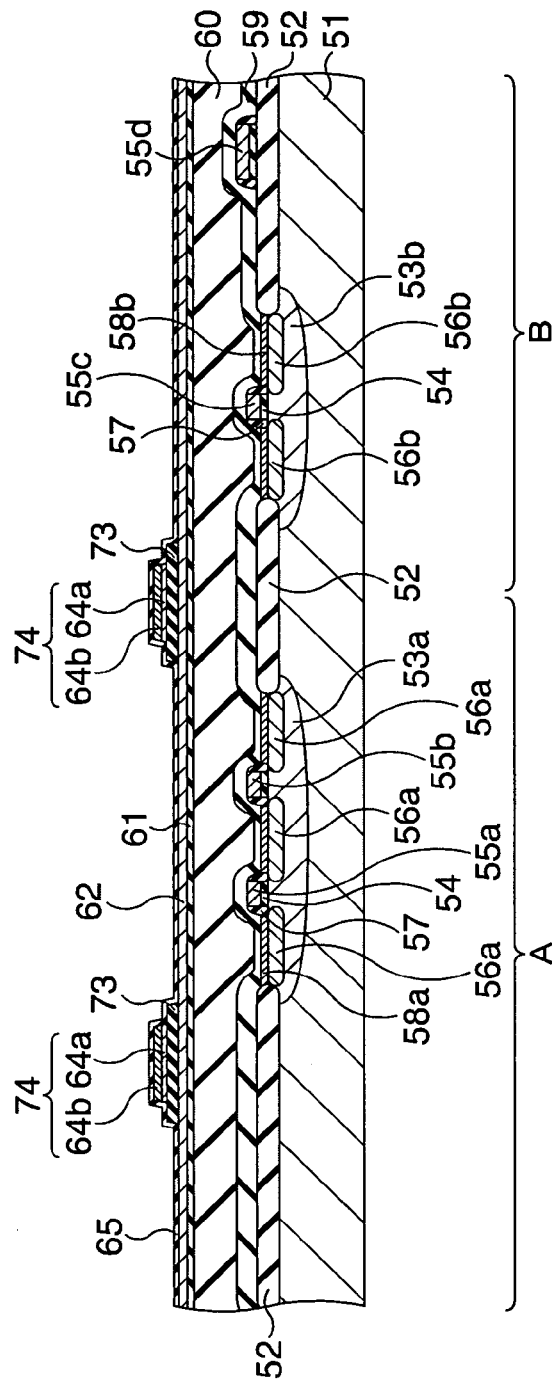
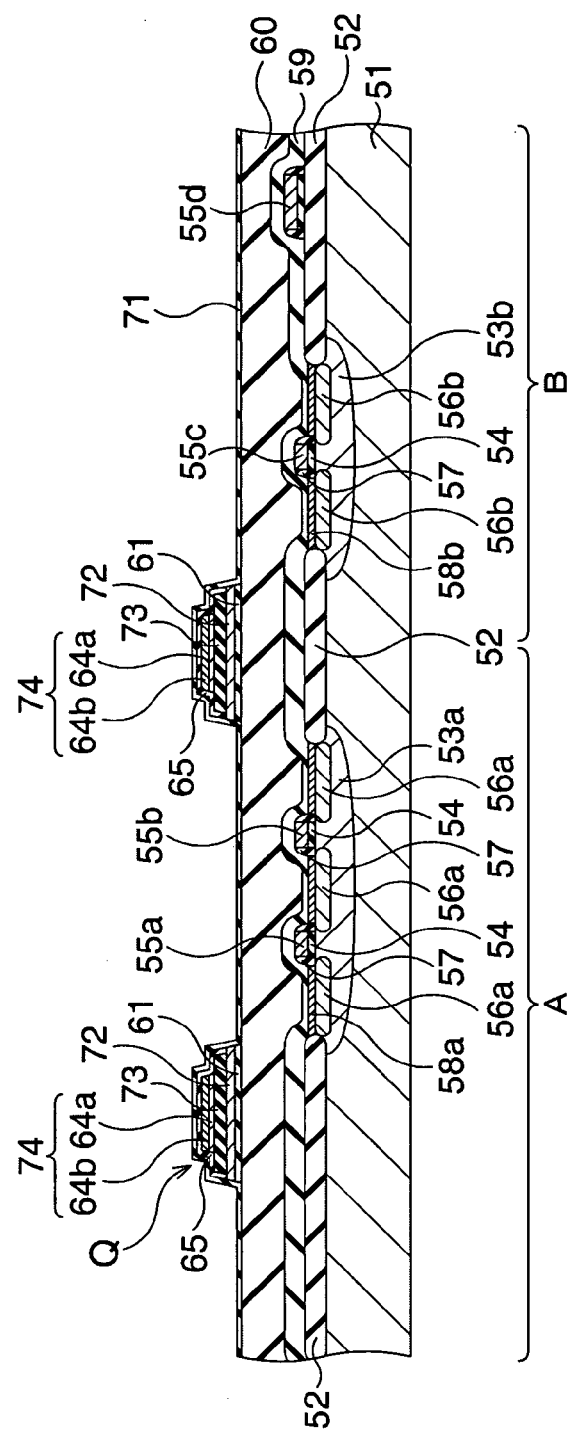
FIG. 2G
FIG. 2H

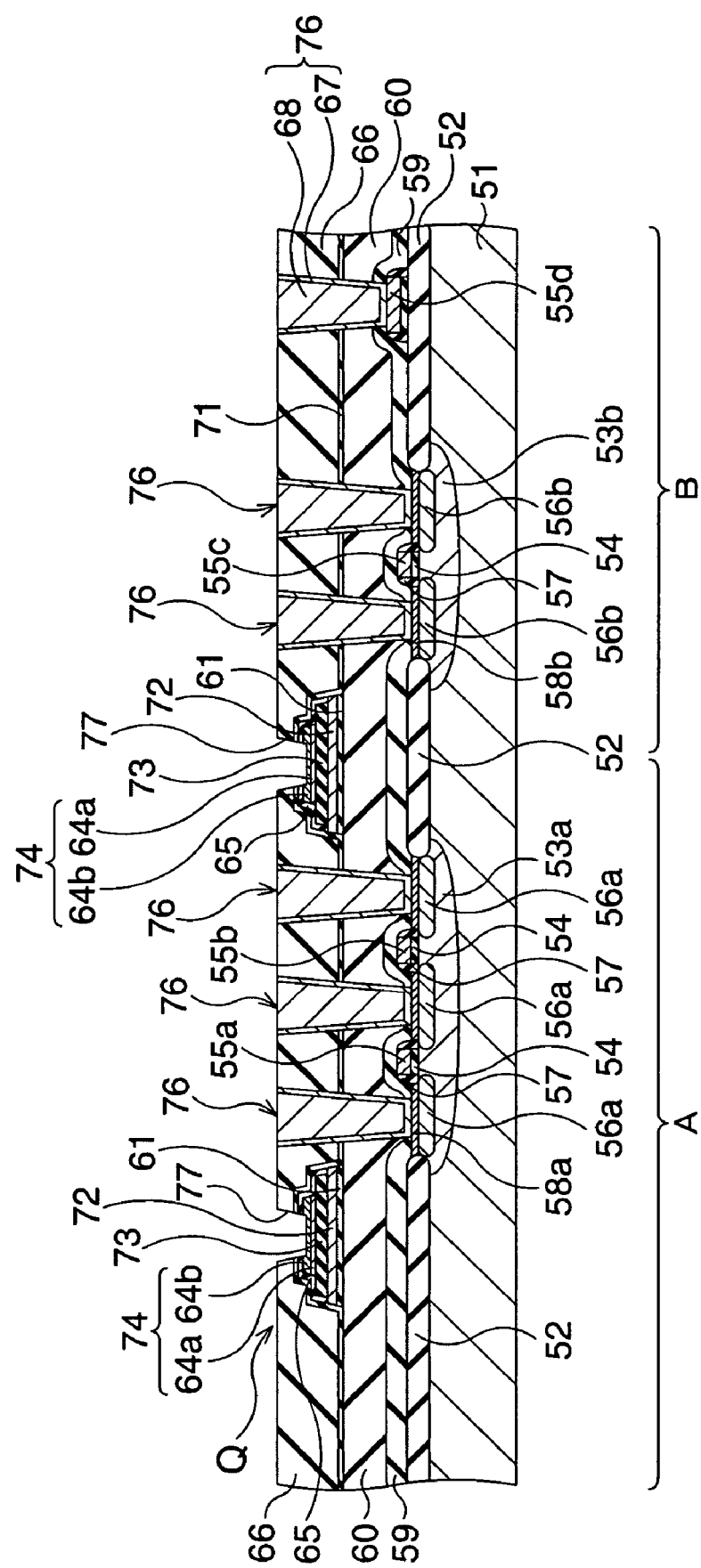

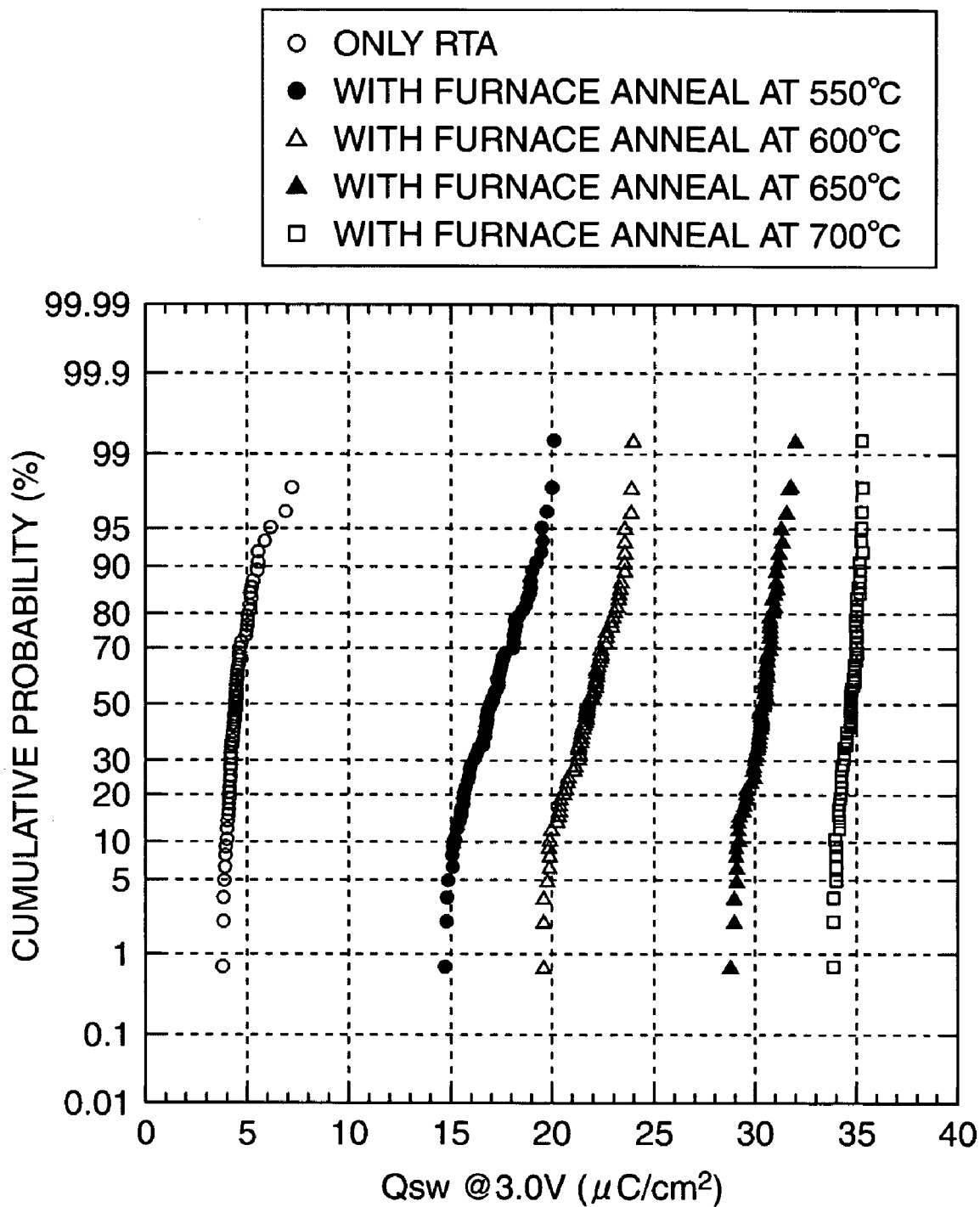

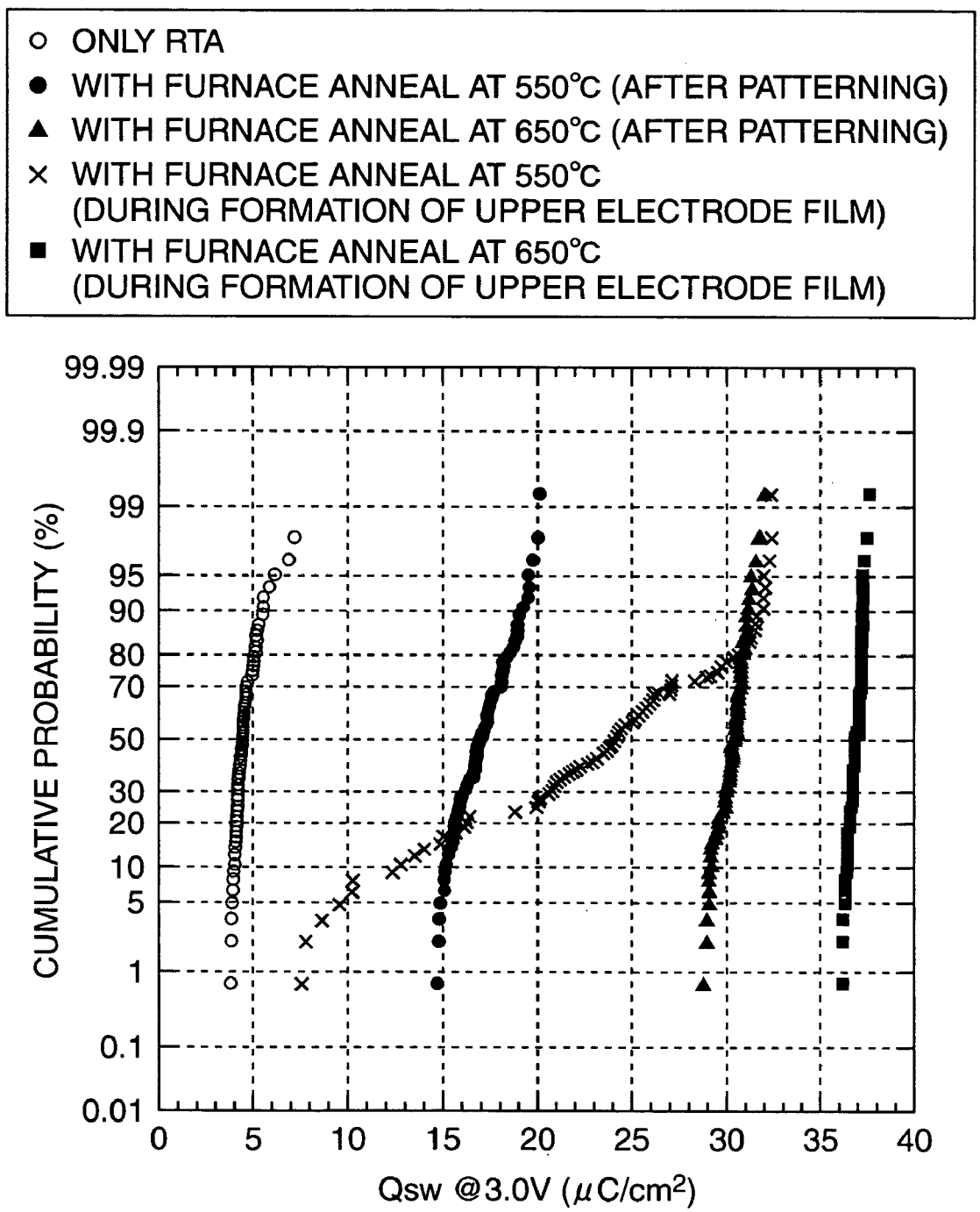

MANUFACTURING METHOD OF SEMICONDUCTER DEVICE

CROSS-REFERENCE TO RELATED APPLICATIONS

This application is based upon and claims the benefit of priority from the prior Japanese Patent Application No. 2003-425785, filed on Dec. 22, 2003, the entire contents of which are incorporated herein by reference.

BACKGROUND OF THE INVENTION

1. Field of the Invention

The present invention relates to a manufacturing method of a semiconductor device suitable for a ferroelectric memory.

2. Description of the Related Art

A flash memory and a ferroelectric memory are known, as a nonvolatile memory that can still store information after the power supply is turned off.

In the flash memory, a floating gate is buried in a gate insulating film of an insulated-gate field effect transistor (IGFET), and information is stored by accumulating electric charges expressing memory information in the floating gate. A tunnel current that passes through the insulating film has to be passed to write and erase the information, and thus comparatively high voltage is needed.

On the other hand, the ferroelectric memory stores information by using a hysteresis characteristic of ferroelectric substance. A ferroelectric capacitor having a ferroelectric film as a capacitor dielectric between a pair of electrodes generates a polarization in response to an applied voltage between the electrodes and has spontaneous polarization even after the applied voltage is removed. If polarity of the applied voltage is inverted, the polarity of the spontaneous polarization is also inverted. The information can be read by detecting the spontaneous polarization. The ferroelectric memory can be driven by the low voltage as compared with the flash memory, and thus can execute high-speed writing with lower power consumption.

The ferroelectric film of the ferroelectric capacitor is formed of a PZT material such as lead-zirconate-titanate (PZT) and La-doped PZT (PLZT), a Bi-layer structure compound such as $SrBi_2Ta_2O_9$ (SBT, Y1) and $SrBi_2(Ta, Nb)_2O_9$ (SBTN, YZ), or the like.

Conventionally, as the method of forming the ferroelectric film, a sol-gel method or a sputtering method is used. By these film forming methods, the ferroelectric film of an amorphous phase is formed on the lower electrode, and thereafter, the ferroelectric film is crystallized to be a crystal of the perovskite structure by thermal treatment.

Since the ferroelectric film is crystallized in an oxygen atmosphere, an capacitor electrode is formed of precious metal such as Pt, and $IrO_2$, $SrRuO_3$, $La_{0.5}Sr_{0.5}CoO_3$ or the like that have conductivity even after oxidized. As for the upper electrode, an interlayer insulating film in a multilayer wiring structure is formed in a reducing atmosphere, and therefore when an upper electrode is formed of precious metal such as Pt and Ir, hydrogen in the reducing atmosphere enters the Pt film or the Ir film and is activated by the catalytic action these metals have. As a result, the ferroelectric film in the ferroelectric capacitor is reduced by the activated hydrogen. When the ferroelectric film is reduced, the operating characteristics of the ferroelectric capacitor are sharply deteriorated. Therefore, conductive oxide which does not have the catalytic action is generally used as raw material of the upper electrode.

For example, Patent Document 1 (Japanese Patent Application Laid-open No. 2002-324894) describes that the upper electrode formed on the ferroelectric film is constituted of a first conductive oxide film and a second conductive oxide film, and the second conductive oxide film is formed to have a composition closer to a stoichiometric composition than the first conductive oxide film.

By making a composition of the first conductive oxide film in contact with the ferroelectric film of the ferroelectric capacitor a non-stoichiometric composition, Pb is diffused into the first conductive oxide film from the ferroelectric film. With this, an interface between the ferroelectric film and the upper electrode is planarized. As a result, a value of effective voltage applied to the ferroelectric film when a voltage is applied to the ferroelectric capacitor becomes larger, and the capacitor characteristics are improved.

However, when such a conductive oxide film of the non-stoichiometric composition is exposed to an atmosphere including hydrogen, a metal component in the film activates hydrogen, and the activated hydrogen deteriorates the ferroelectric film.

Thus, Patent Document 1 discloses a method for blocking entry of a reduction atmosphere into the first conductive oxide film by forming the second conductive oxide film having the stoichiometric composition or the composition closer to the stoichiometric composition on the first conductive oxide film.

Patent Document 2 (Japanese Patent Application Laid-open No. 2002-246564) describes an annealing method in a case in which the upper electrode formed on the ferroelectric film is made of a conductive oxide film. In this method, after the ferroelectric film (PZT film) of the amorphous phase is formed, it is crystallized to the perovskite structure by a first rapid thermal annealing (RTA). Next, after a conductive oxide film is formed as the upper electrode, crystallization of the PZT is completed by a second RTA. The capacitor characteristics are improved by simultaneously annealing the PZT film and the conductive oxide film (upper electrode film).

However, it describes that when a process step of simultaneously annealing the PZT film and the conductive oxide film (upper electrode film) by RTA is performed in a mixed gas containing oxygen of high partial pressure, foreign matters are formed on the upper electrode film. It is possible that these foreign matters interfere with subsequent process steps, and therefore it is necessary to prevent the foreign matters from being formed. Japanese Patent Application Laid-open No. 2002-246564 describes that when a process step of annealing the PZT and the upper electric layer together by RTA after film forming is carried out in a mixed gas containing about 1% of oxygen in an inert atmosphere such as an argon gas, generation of the foreign matter is inhibited.

However, even with adoption of any method of them, a sufficient quantity of switching electric charge to be demanded hereinafter cannot be obtained.

SUMMARY OF THE INVENTION

The present invention has its object to provide a manufacturing method of a semiconductor device capable of obtaining a larger quantity of switching electric charge, and preferably, obtaining favorable fatigue characteristics.

The inventors of the present invention have conceived the modes of the invention which will be shown hereinafter as a result of repeated earnest studies to solve the aforesaid problem.

In a manufacturing method of a semiconductor device according to the present invention, a conductive film is formed, and thereafter a ferroelectric film is formed on the aforesaid conductive film. Next, a first conducive oxide film is formed on the ferroelectric film. Subsequently, furnace annealing for the ferroelectric film is performed in an atmosphere containing oxygen. Then, a second conductive oxide film is formed on the first conductive oxide film.

BRIEF DESCRIPTION OF THE DRAWINGS

FIG. 4 is a graph showing relationship of annealing temperature and quantity of switching electric charge when furnace annealing is performed after patterning of an upper electrode film;

FIG. 5 is a graph showing relationship of annealing temperature and quantity of switching electric charge when furnace annealing is performed during formation of an upper electric film.

DETAILED DESCRIPTION OF THE PREFERRED EMBODIMENTS

Figure 1:
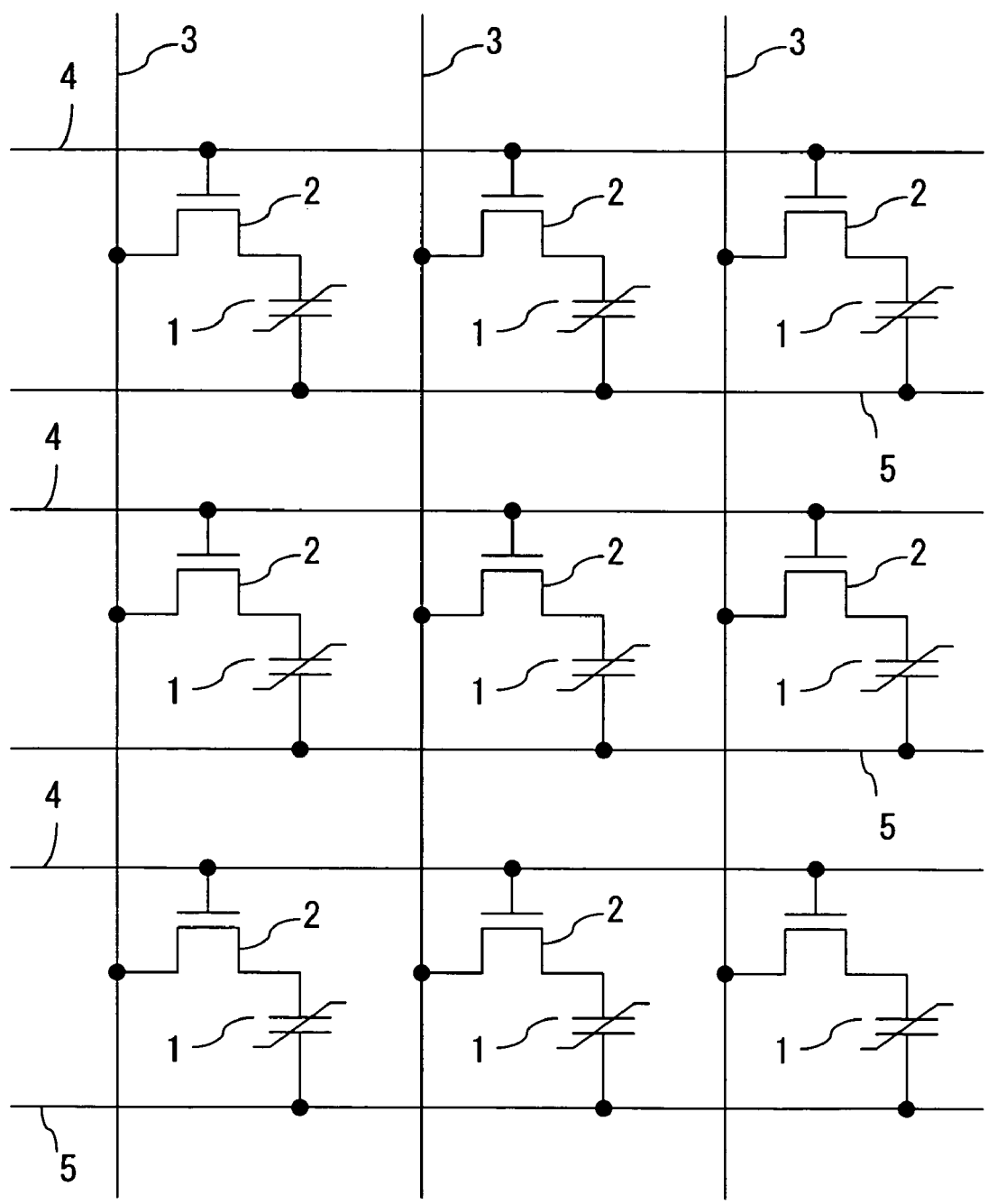
FIG. 1 is a circuit diagram showing a constitution of a memory cell array of a ferroelectric memory manufactured according to an embodiment of the present invention.

Embodiments of the present invention will be concretely explained hereinafter with reference to the attached drawings. FIG. 1 is a circuit diagram showing a constitution of a memory cell array of a ferroelectric memory (semiconductor device) manufactured by a method according to the embodiments of the present invention.

The memory cell array is provided with a plurality of bit lines 3 extending in one direction and a plurality of word lines 4 and plate lines 5 extending in a direction orthogonal to the direction in which the bit lines 3 extend. A plurality of memory cells of the ferroelectric memory according to the embodiments are disposed in an array form to conform to a grid constructed by these bit lines 3, word lines 4 and plate lines 5. Each of the memory cells is provided with a ferroelectric capacitor 1 and a MOS transistor 2.

A gate of the MOS transistor 2 is connected to the word line 4. One source/drain of the MOS transistor 2 is connected to the bit line 3, and the other source/drain is connected to one electrode of the ferroelectric capacitor 1. The other electrode of the ferroelectric capacitor 1 is connected to the plate line 5. Each of the word lines 4 and plate lines 5 are shared by a plurality of MOS transistors 2 aligned in the same direction as the direction in which they extend. Similarly, each of the bit lines 3 is shared by a plurality of MOS transistors 2 aligned in the same direction as the direction in which the bit line 3 extends. The direction in which the word line 4 and the plate line 5 extend is sometimes called a row direction and the direction in which the bit line 3 extends is called a column direction.

In the memory cell array of the ferroelectric memory thus constituted, data is stored correspondingly to polarization state of the ferroelectric film provided at the ferroelectric capacitor 1.

First Embodiment

Figure 2A:
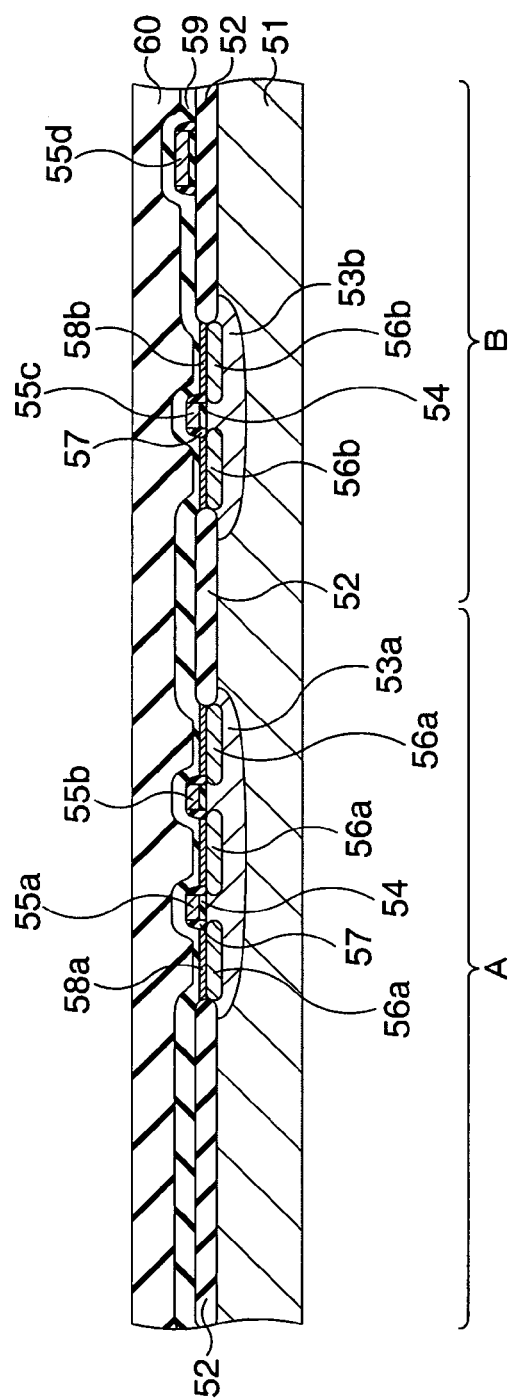
FIGS. 2A to 2R are sectional views each showing a manufacturing method of the ferroelectric memory according to a first embodiment of the present invention in sequence of the process steps.

Next, a first embodiment of the present invention will be explained. FIG. 2A to FIG. 2R are sectional views showing a manufacturing method of the ferroelectric memory (semiconductor device) according to the first embodiment of the present invention.

In this embodiment, a device isolation insulating film 52 is first formed on a surface of a silicon substrate 51, first, as shown in FIG. 2A. Next, a p-well 53a and an n-well 53b are formed by selectively introducing a p-type impurity and an n-type impurity, respectively into predetermined active regions (transistor forming regions) in a memory cell region A and a peripheral circuit region B. A conductive type of the silicon substrate 51 may be either the p-type or the n-type. Next, a silicon oxide film is formed as a gate insulating film 54 by thermally oxidizing surfaces of the active regions of the silicon substrate 1. Then, an amorphous or a polycrystalline silicon film is formed on an entire upper surface of the silicon substrate 51. Then, resistance of the silicon film is lowered by performing ion-implantation into its inside. Thereafter, by patterning the silicon film into the predetermined shapes by a photolithography method, gate electrodes 55a and 55b which extend in parallel to each other in the memory cell region A are formed, and gate electrodes 55c and 55d are formed in the peripheral circuit region B. The gate electrodes 55a and 55b constitutes a part of the word line 4.

Next, n-type impurity diffusion regions 56a serving as a source/drain of an n-channel MOS transistor are formed by ion-implantation of an n-type impurity into the p-well 53a on both sides of the gate electrodes 55a and 55b, and n-type impurity diffusion regions (not shown) are also formed in the p-well (not shown) in the peripheral circuit region B. Then, p-type impurity diffusion regions 56b serving as a source/drain of a p-channel MOS transistor are formed in the peripheral circuit region B by ion-implantation of a p-type impurity into the n-well 53b on both sides of the gate electrode 55c.

Then, after an insulating film is formed above an overall surface of the silicon substrate 51, the insulating film is left as a side wall insulating film 57 only on both side portions of the gate electrodes 55a, 55b, 55c and 55d by etching back the insulating film. A silicon oxide ($SiO_2$) may be formed as the insulating film by the CVD method, for example. Then, while using the gate electrodes 55a, 55b and 55c and the side wall insulating films 57 as a mask, the n-type impurity diffusion regions 56a are formed into an LDD structure by implanting an n-type impurity ion into the p-well 53a once again, and the p-type impurity diffusion regions 56b are also formed into the LDD structure by implanting a p-type impurity ion into the n-well 53b once again. The ion-implantation of the n-type impurity and the p-type impurity is carried out individually by using, for example, a resist pattern.

As described above, an n-type MOSFET is composed of the p-well 53a, the gate electrode 55a or 55b, the n-type impurity diffusion region 56a and the like, in the memory cell region A, and a p-type MOSFET is composed of the n-well 53b, the gate electrode 55c, the p-type impurity diffusion region 56b and the like, in the peripheral circuit region B.

Next, a refractory metal film, for example, a Ti film or a Co film is formed on an overall surface, and refractive metal silicide layers 58a and 58b are formed on surfaces of the n-type diffusion regions 56a and the p-type impurity diffusion regions 56b respectively by heating the refractory metal film. Thereafter, the unreacted refractory metal film is removed by wet etching.

Next, a silicon oxide nitride (SiON) film about 200 nm thick is formed as a cover film 59 above the overall surface of the silicon substrate 51 by the plasma CVD method. Then, a silicon dioxide ($SiO_2$) about 1.0 μm thick is formed as an interlayer insulating film 60 on the cover film 59 by the plasma CVD method using the TEOS gas. Thereafter, a surface of the interlayer insulating film 60 is planarized by polishing it by a chemical mechanical polishing (CMP: Chemical Mechanical Polishing) method.

Figure 2B:
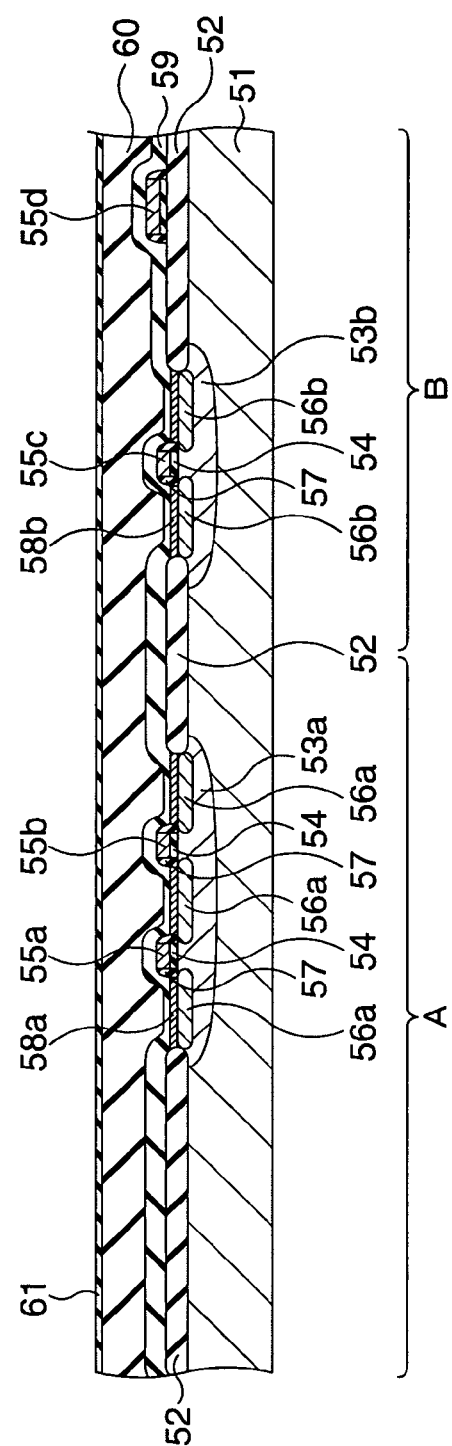

Thereafter, as shown in FIG. 2B, an $Al_2O_3$ film 61 of a thickness of 20 nm is formed on the interlayer insulating film 60 by an RF sputtering method at a room temperature. The $Al_2O_3$ film 61 works to enhance adhesion of a conductive film (lower electric film) formed on this film and the underlying $SiO_2$ film (interlayer insulating film 60), and prevent Pb diffusion into a PLZT film formed on the conductive film.

Figure 2C:
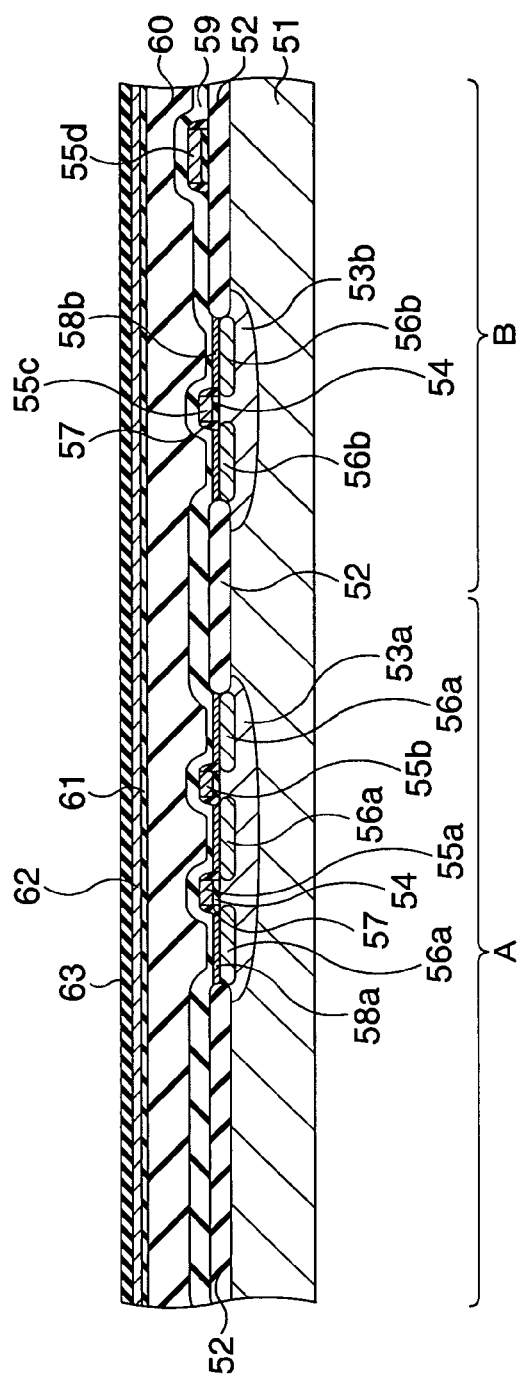

Subsequently, as shown in FIG. 2C, a Pt film 62 of a thickness of 150 nm is formed as the conductive film on the $Al_2O_3$ film 61 by a sputtering method. Film forming conditions at this time are, for example, Ar gas pressure: 0.6 Pa, DC power: 1 kW, and temperature: 350° C. An iridium film, a ruthenium film, an iridium oxide film, a ruthenium oxide film, a strontium ruthenium oxide ($SrRuO_3$) or the like may be formed as the first conductive film, other than the Pt film 62. Next, a PLZT (lead lanthanum zirconate titanate: $Pb_{1-3x/2}La_x$) $(Zr_{1-y}Ti_y)O_3$) film 63, which is formed by adding lanthanum (La) to the PZT, is formed on the Pt film 62 by an RF sputtering method to have a thickness of 150 nm. Calcium (Ca) and/or strontium (Sr) may be added to the PLZT film 63. At this point of time, the PLZT film 63 is in an amorphous state.

Next, the silicon substrate 51 is placed in an atmosphere containing oxygen having a partial pressure of less than 10% of the atmospheric pressure and the PLZT film 63 is crystallized by performing RTA (Rapid Thermal Annealing) treatment for the PLZT film 63 under conditions of, for example, temperature: 585° C., time: 90 seconds, temperature increasing speed: 125° C./second, and atmosphere: $O_2$: 2.5%/Ar: 97.5%. As a method of forming the ferroelectric film, there are a spin-on method, a sol-gel process, an MOD (Metal Organic Deposition) method and the like in addition to the above-described sputtering method. Further, as the ferroelectric film, a PZT (($Pb(Zr_{1-x}Ti_x)O_3$) film, an $SrBi_2(Ta_xNb_{1-x})_2O_9$ (where $0<x\leq1$) film, a $Bi_4Ti_2O_{12}$ film or the like may be formed other than the PLZT film 63.

Figure 2D:
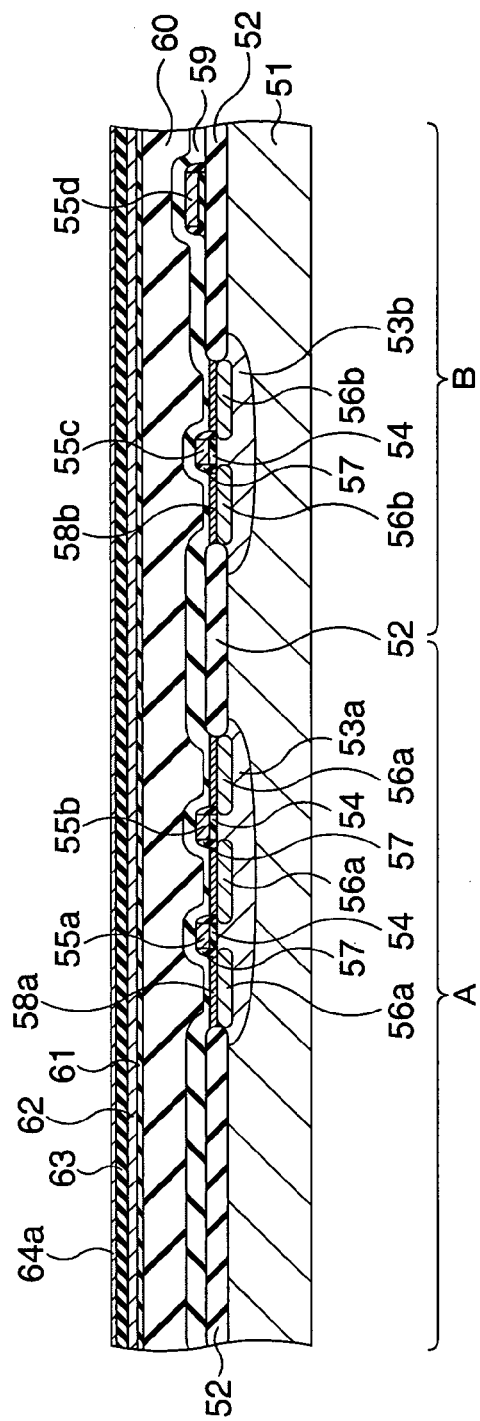

Next, as shown in FIG. 2D, an iridium oxide ($IrO_x$, where $0<x<2$) film 64a of a thickness of 20 nm to 75 nm, for example, a thickness of 50 nm is formed on the PLZT film 63 as a first conductive oxide film by a reactive sputtering method. Thereafter, thermal treatment at temperature: 725° C. for time: one minute in an atmosphere: $O_2$: 1%/Ar:99% is performed, for example, by RTA in an atmosphere containing oxygen having partial pressure of less than 5% of the atmospheric pressure. As a result, crystallization of the PLZT film 63 is promoted, and annealing treatment is performed for the $IrO_x$ film 64a.

Thereafter, furnace annealing is performed at 600° C. or higher, for example, 650° C., for 60 minutes in, for example, $O_2$ atmosphere as recovery annealing to recover oxygen deficiency in the PLZT film 63. In this case, if the thickness of the first conductive oxide film is less than 20 nm, there is a possibility that Pb in the PLZT film may diffuse during the RTA and the furnace annealing. On the other hand, if the thickness of the first conductive oxide film exceeds 75 nm, there is a possibility that supply of oxygen to the PLZT film 63 may become insufficient.

Figure 2E:
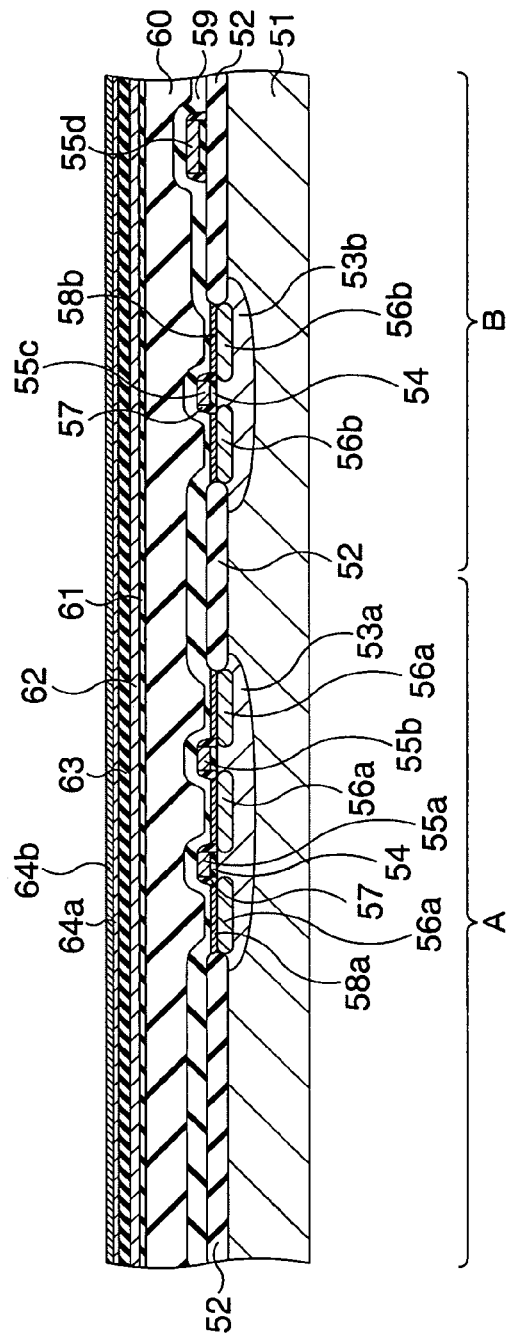

Subsequently, as shown in FIG. 2E, an iridium oxide ($IrO_2$) film 64b of a thickness of 100 nm to 300 nm, for example, a thickness of 200 nm is formed on the $IrO_x$ film 64a as a second conductive oxide film by a sputtering method. A strontium ruthenium oxide ($SrRuO_3$) film may be formed by a sputtering method as the second conductive oxide film. In this case, if the thickness of the second conductive oxide film is less than 100 nm, there is a possibility that the function as the upper electrode cannot be sufficiently obtained. On the other hand, if the thickness of the second conductive oxide film exceeds 300 nm, there is a possibility that supply of oxygen to the PLZT film 63 may become insufficient in the subsequent process step.

Figure 2F:
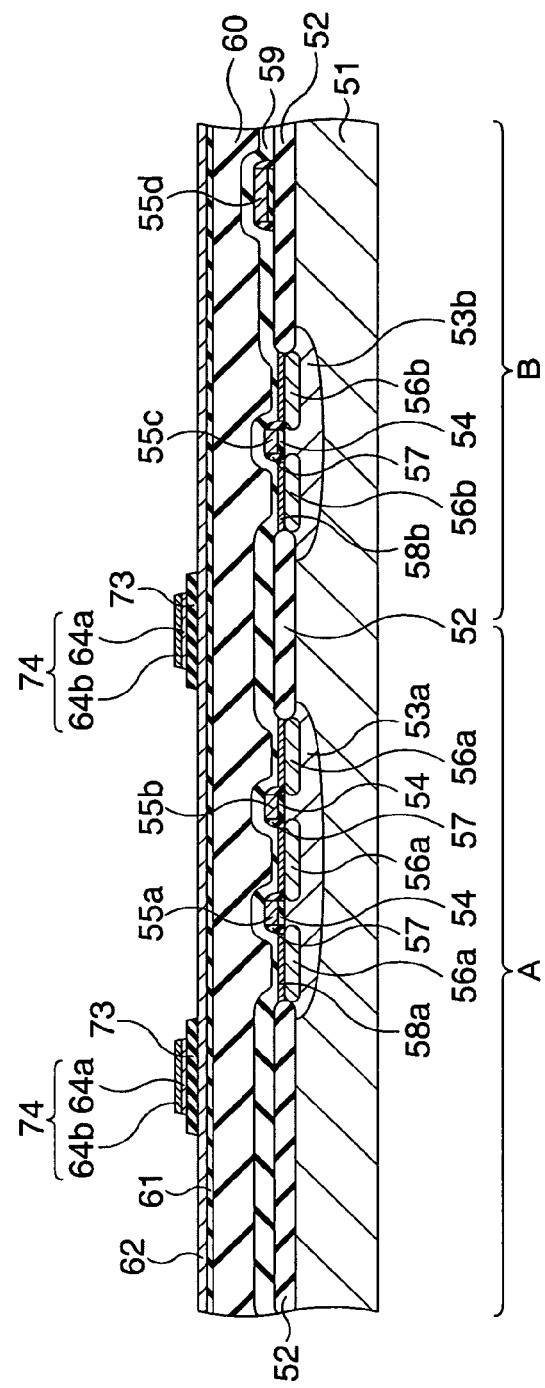

Next, as shown in FIG. 2F, in the memory cell area A, a resist pattern (not shown) is formed on the $IrO_2$ film 64b as a mask on an occasion of forming the upper electrode, and the $IrO_2$ film 64b and the $IrO_x$ film 64a are etched by using this resist pattern as the mask, whereby upper electrodes 74 of the ferroelectric capacitor are formed. Then, the resist pattern is removed, and another resist pattern (not shown) as a mask on an occasion of forming a capacitor insulating film is formed on the upper electrodes 74 and their peripheral areas, and the PLZT film 63 is etched by using this resist pattern as the mask, whereby capacitor insulating films 73 of the ferroelectric capacitors are formed. Thereafter, the resist pattern is removed, and the PLZT film 63 is annealed at 350° C. for 60 minutes in an oxygen atmosphere. The annealing removes residual organic substances from the resist and degases moisture absorbed in the formed films.

Subsequently, as shown in FIG. 2G, an $Al_2O_3$ film 65 of a thickness of 50 nm is formed as an encapusulation layer for covering the upper electrodes 74, the capacitor insulating film 73 and the Pt film 62, at a room temperature by an RF sputtering method. The $Al_2O_3$ film 65 as the encapsulation layer can protect the capacitor insulating film 73 constituted of PLZT, which is ready to be reduced, from hydrogen and moisture, and prevent hydrogen and moisture from entering the inside of it. In this case, a PZT film, a PLZT film or a titanium oxide film may be formed as the encapsulation layer. The $Al_2O_3$ film, the PZT film, the PLZT film or the titanium oxide film can be formed by, for example, an MOCVD method.

Next, photoresist (not shown) is applied on the overall surface, and it is left on the upper electrodes 74, the capacitor insulating film 73 and their peripheral areas by exposing and developing it. Then, the $Al_2O_3$ film 65, the Pt film 62 and the $Al_2O_3$ film 61 are etched by using the remaining photoresist as a mask, whereby lower electrodes 72 of the ferroelectric capacitor are formed as shown in FIG. 2H. As a result, ferroelectric capacitors Q each constituted of the lower electrode 72, the capacitor insulating film 73 and the upper electrode 74 are formed, as shown in FIG. 2H.

Next, the photoresist is removed, and annealing is performed in an oxygen atmosphere at 350° C. for 60 minutes. Thereafter, an $Al_2O_3$ film 71 of a thickness of 20 nm is further formed as an encapusulation layer by a sputtering method. The annealing performed before the $Al_2O_3$ film 71 is formed prevents peeling-off of the $Al_2O_3$ film 71. Subsequently, annealing is performed in an oxygen atmosphere at 650° C. for 60 minutes, whereby the capacitor insulating film 73 is restored from the damage.

Figure 2I:
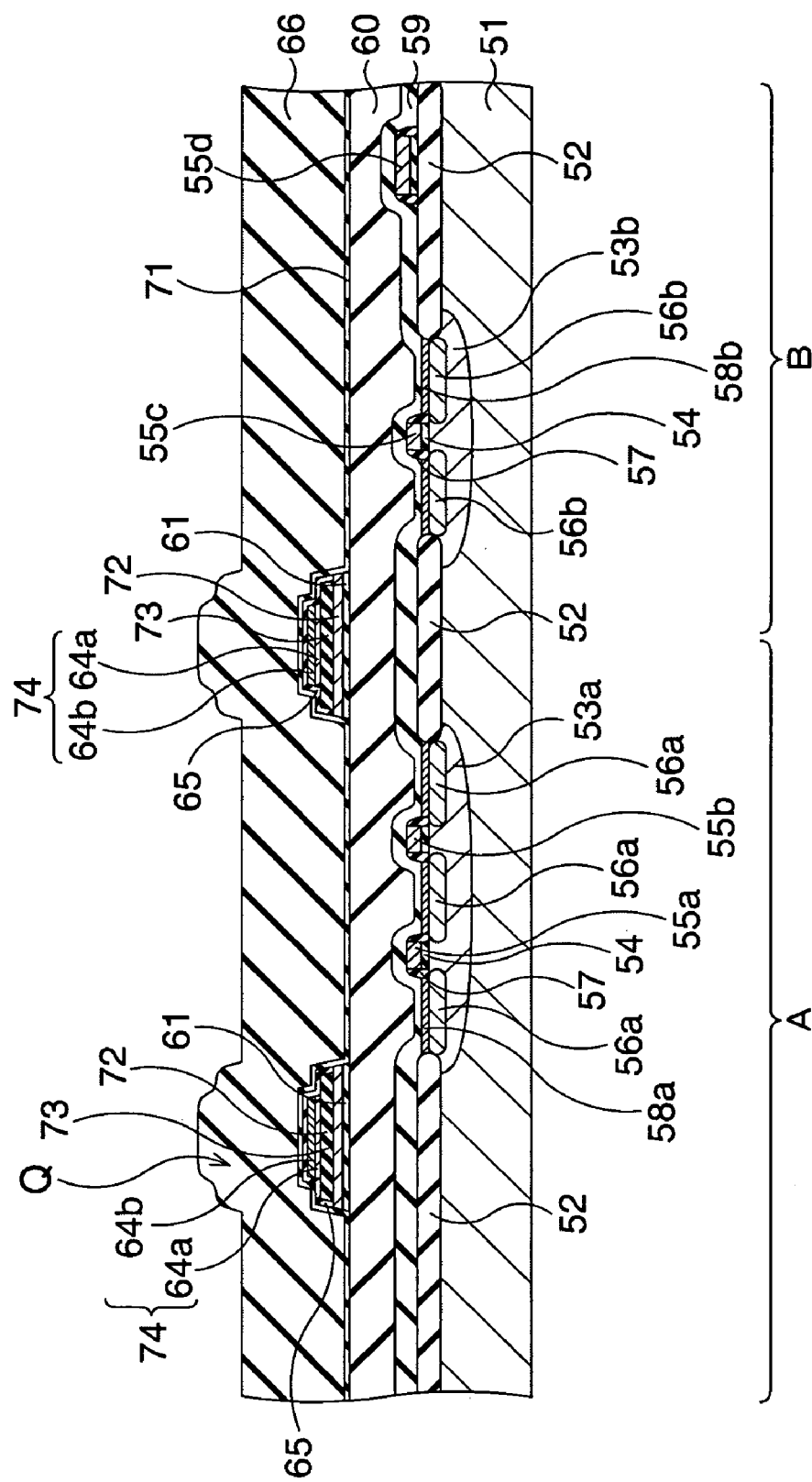

Thereafter, an $SiO_2$ film of thickness of about 1500 nm is formed as an interlayer insulating film 66 on the overall surface by a CVD method, as shown in FIG. 2I. Upon growth of the interlayer film 66, the silane ($SiH_4$), polysilane compounds ($Si_2F_6$, $Si_3F_8$, $Si_2F_3Cl$ or the like) or the $SiF_4$ may be used, or the TEOS may be used, as a film forming gas. Any of plasma excitation (ECR method: Electron cyclotron Resonance, ICP method: Inductively Coupled Plasma, HDP: High Density Plasma, EMS: Electron Magneto-Sonic), thermal excitation, and excitation by laser light may be used as an excitation method.

Figure 2J:
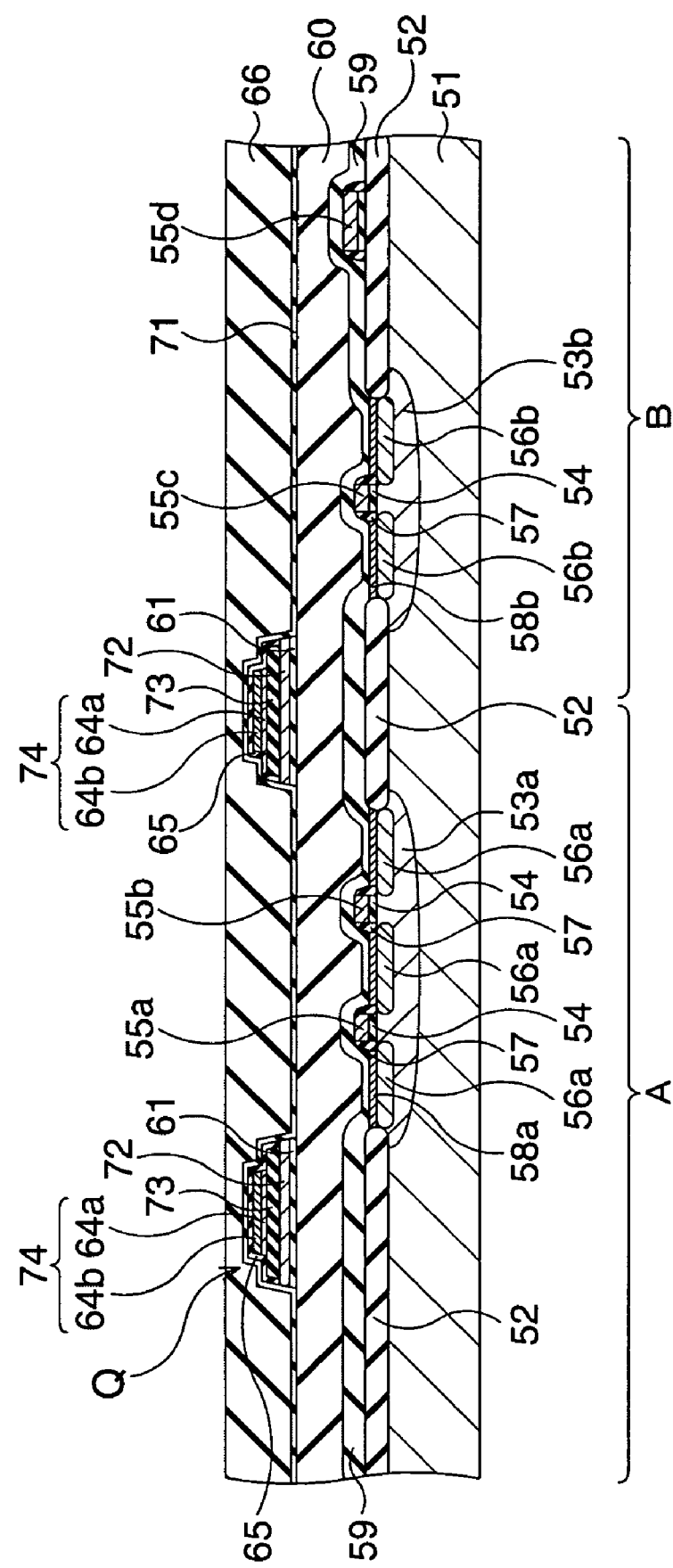
Figure 2K:
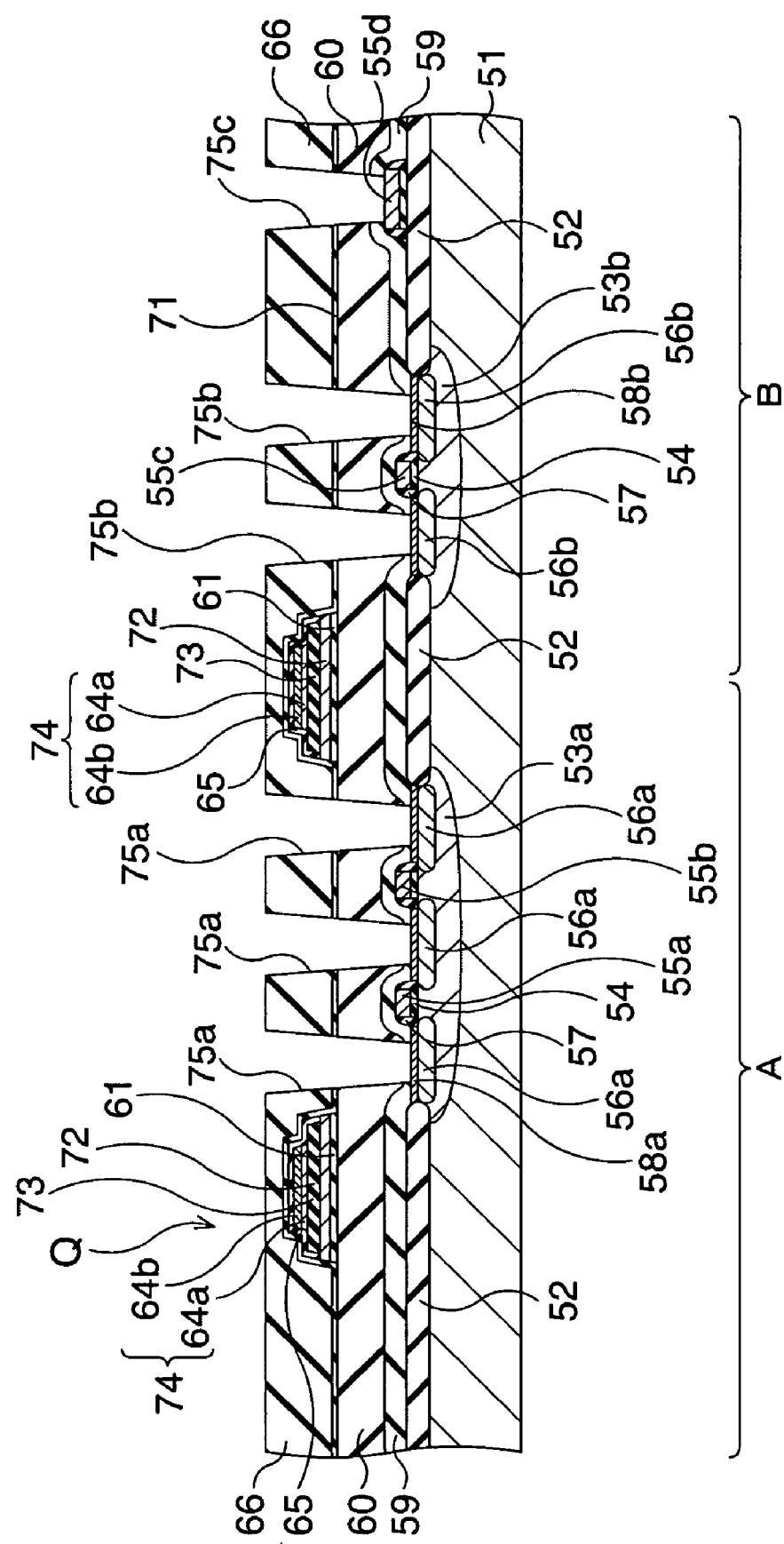

Subsequently, the interlayer insulating film 66 is planarized by a chemical mechanical polishing (CMP) method as shown in FIG. 2J. The surface planarization of the interlayer insulating film 66 may be continued until the thickness of the interlayer insulating film 66 becomes about 400 nm with, for example, an upper surface of the upper electrode 74 as a reference. A slurry containing moisture is used on the planarizaion by the CMP method, and the moisture in the slurry and moisture in cleaning liquid used in a later cleaning step are stuck onto the surface of the interlayer insulating film 66 and absorbed into the inside of it.

Therefore in the present embodiment, the moisture on the surface and in the inside is discharged outside by heating the interlayer insulating film 66 at 390° C. in a vacuum chamber (not shown). After such dehydration treatment, the film quality thereof is improved by exposing the interlayer insulating film 66 to the $N_2O$ plasma while heating it. As a result, the deterioration of the ferroelectric capacitor Q caused by the heating in later steps can be prevented. Such a series of dehydration treatment and the plasma treatment may be conducted in the same chamber (not shown). For example, a supporting electrode on which the silicon substrate 51 is loaded, and an opposing electrode opposed to the supporting electrode is arranged in the chamber used at this time, and a state in which a high frequency power supply is connectable to the opposing electrode is established. Then, in the state in which an $N_2O$ gas is introduced into the chamber, the high frequency power supply is applied to the opposing electrode to generate the $N_2O$ plasma between the supporting electrode and the opposing electrode, whereby the $N_2O$ plasma treatment for the interlayer insulating film 66 is carried out. After such $N_2O$ plasma treatment, nitrogen exists at least on the surface of the interlayer insulating film 66. It is preferable that the substrate temperature at the time of the dehydration process and the substrate temperature at the time of plasma treatment are substantially constant.

It is preferable to use the $N_2O$ plasma in the plasma process following the dehydration process, but an NO plasma, an $N_2$ plasma or the like may be used. The above described series of treatments of the dehydration treatment and the plasma treatment may be also performed after another interlayer insulating film is formed later.

Thereafter, photoresist (not shown) is applied on the interlayer insulating film 66, and it is exposed and developed. The interlayer insulating film 66, the $Al_2O_3$ film 71, the interlayer insulating film 60 and the cover film 59 are dry-etched by using the photoresist as a mask, whereby contact holes 75a each reaching the silicide layer 58a in the memory cell region A, contact holes 75b each reaching the silicide layer 58b in the peripheral circuit region B, and contact holes 75c each reaching the gate electrode 55d on the device separation insulating film 52 in the peripheral circuit region B are simultaneously formed. At this time, the interlayer insulating film 66, the $Al_2O_3$ film 71, the interlayer insulating film 60 and the cover film 59 can be etched by using a CF series gas, for example, a mixed gas obtained by adding $CF_4$ and Ar to $CHF_3$.

Figure 2L:
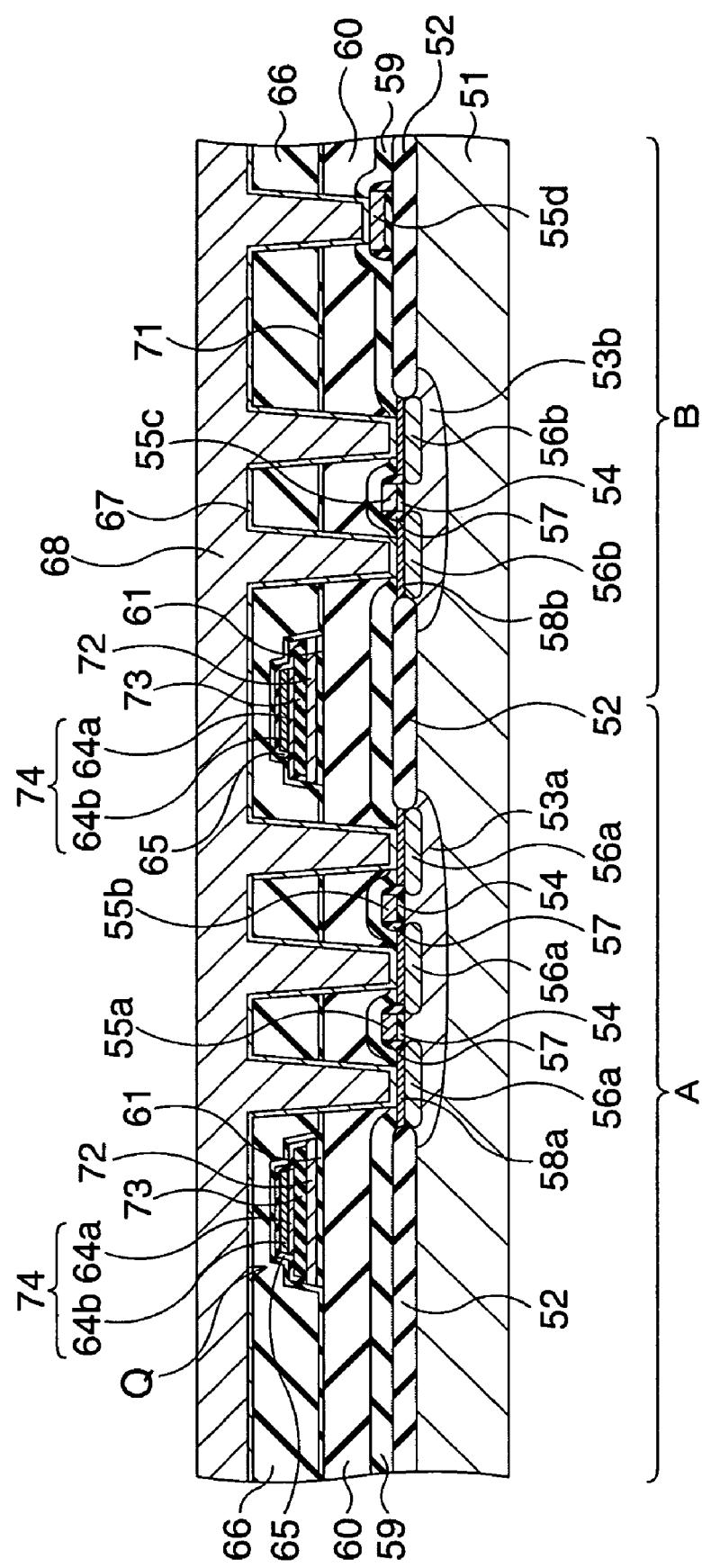

Subsequently, an RF pretreatment etching is performed for the surface of the interlayer insulating film 66 and the inner surfaces of the contact holes 75a to 75c, and thereafter, a Ti film and a TiN film are formed on the overall surface by a sputtering method, whereby a barrier metal film 67 is formed as shown in FIG. 2L. The thicknesses of the Ti (titanium) film and the TiN (titanium nitride) film are 20 nm and 50 nm, respectively. Next, a W (tungsten) film 68 is formed on the barrier metal film 67 by a CVD method using mixed gas of a tungsten fluoride ($WF_6$) gas, argon, and hydrogen. A silane ($SiH_4$) gas is also used at the early stage of growth of the tungsten film 68. A thickness of the tungsten film 68 is set to bury the contact holes 75a to 75c completely, for example, about 500 nm on the barrier metal film 67.

Figure 2M:
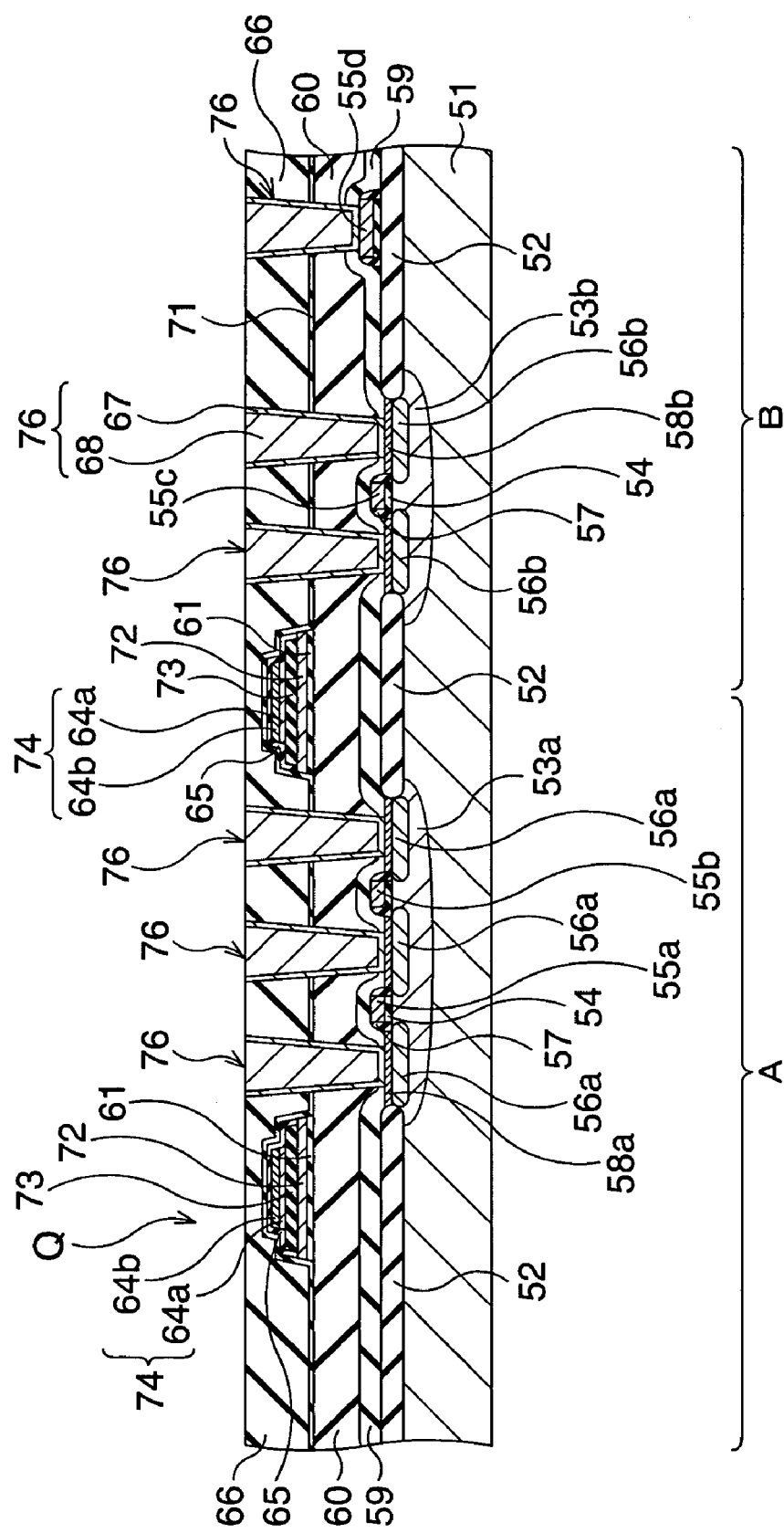

Next, as shown in FIG. 2M, the tungsten film 68 and the barrier metal 67 on the interlayer insulating film 66 are removed by a CMP method, and the tungsten film 68 and the barrier metal 67 are left only in the contact holes 75a to 75c, whereby a contact plug 76 is formed in each of the contact holes.

Figure 2N:
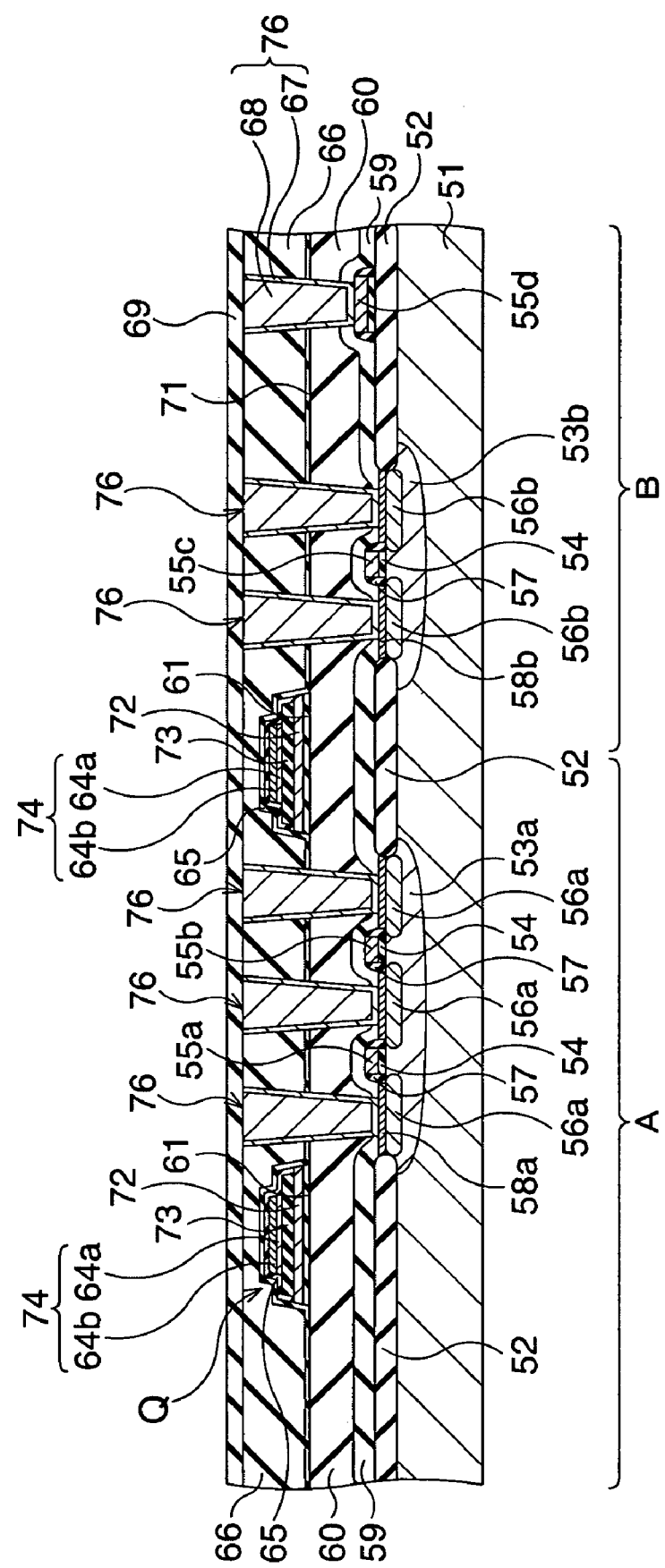

Next, in order to remove the moisture adhered to the surface of the interlayer insulating film 66 and the moisture penetrated into the inside of it in the cleaning process performed after the formation of the contact holes 75a to 75c, the cleaning process performed after the CMP and the like, the interlayer insulating film 66 is heated at the temperature of 390° C. in a vacuum chamber to discharge the moisture to the outside. Further, annealing to improve the film quality of the interlayer insulating film 66 is performed for two minutes, for example, by exposing the interlayer insulating film 66 to the $N_2O$ plasma while heating it. Thereafter, as shown in FIG. 2N, a plasma SION film 69 of a thickness of, for example, 100 nm for covering the contact plugs 76 is formed on the interlayer insulating film 66, as an oxidation preventing film for tungsten.

Figure 2O:
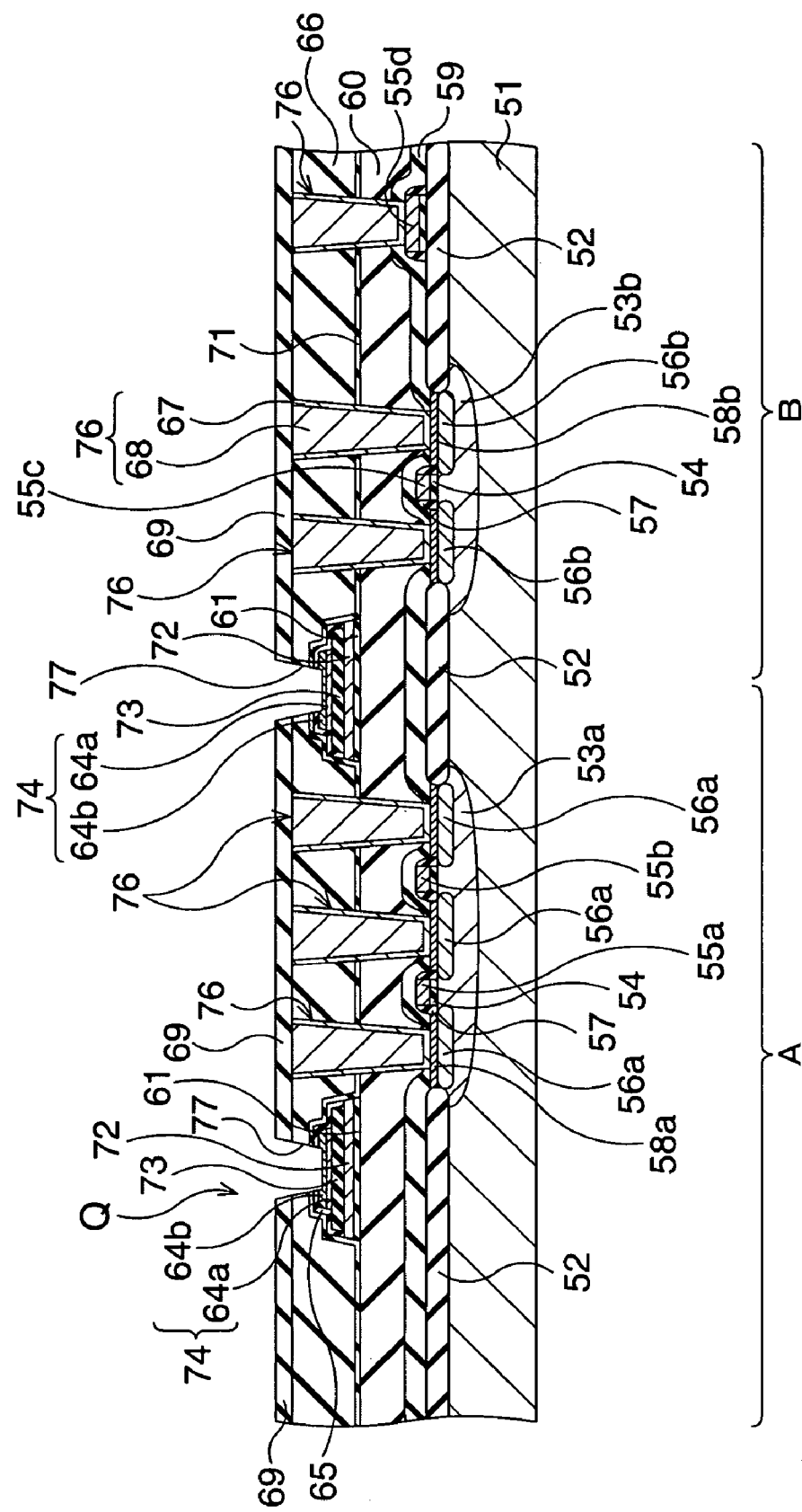

Thereafter, as shown in FIG. 2O, holes 77 reaching the upper electrodes 74 and holes (not shown) reaching the lower electrodes are formed by using a resist pattern. These holes 77 and the like are simultaneously formed by etching, for example. A CF series gas, for example, a mixed gas obtained by adding $CF_4$ and Ar to $CHF_3$ may be used in the etching at this time. The $Al_2O_3$ films 65 and 71 are also etched by using these gases. Subsequently, the resist pattern is removed, and ferroelectric characteristics of the capacitor insulating film 73 is restored by carrying out annealing at 500° C. for 60 minutes in an oxygen atmosphere. At this time, the contact plugs 76, which are ready to be oxidized, are covered with the plasma SiON film 69, and therefore they are not oxidized.

Next, as shown in FIG. 2P, the contact plugs 76 are exposed by removing the plasma SiON film 69 by an etching back method. As a result, the surfaces of the contact plugs 76 protrude from the surface of the interlayer insulating film 66.

Figure 2Q:
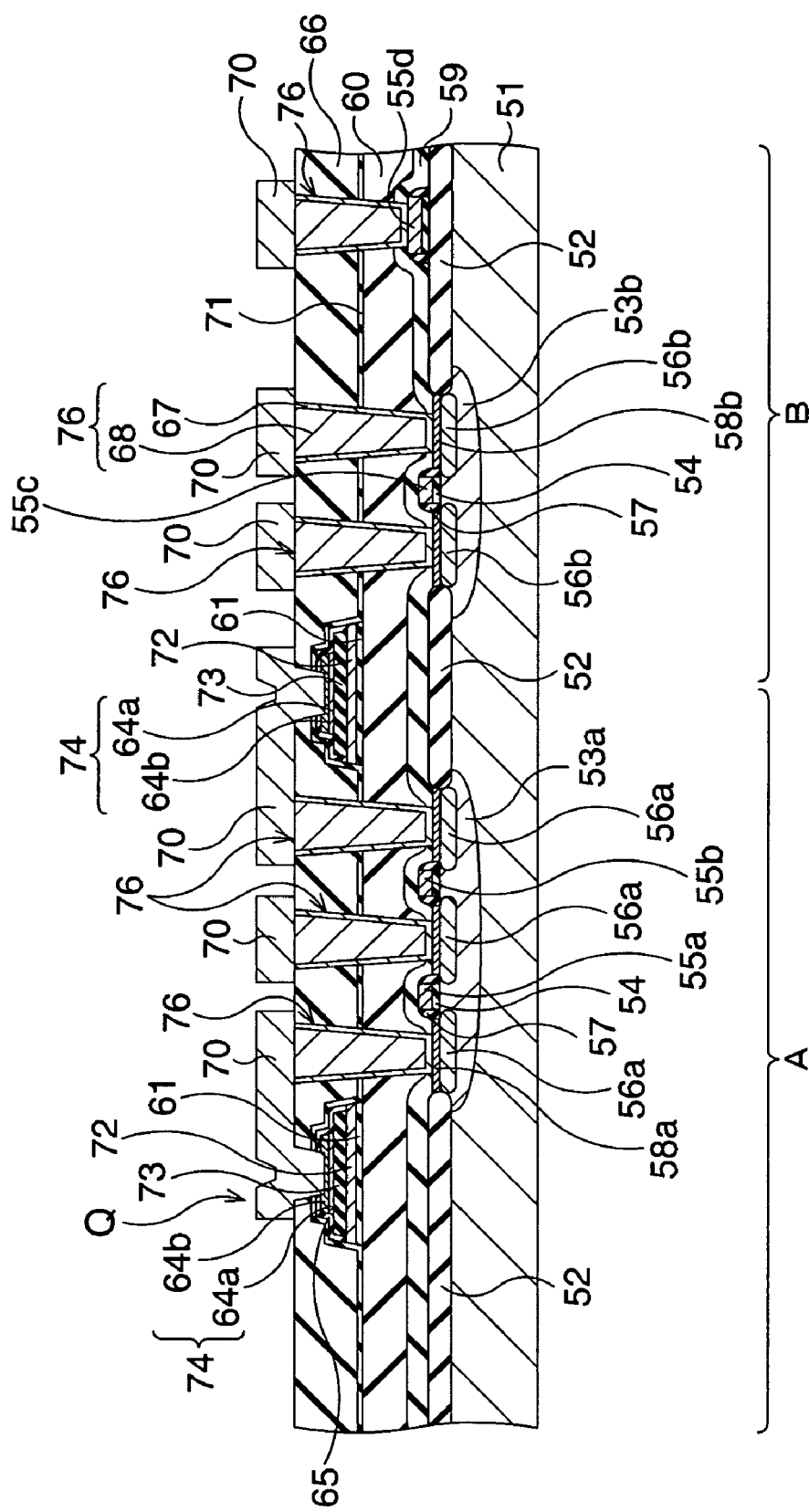
Figure 2R:
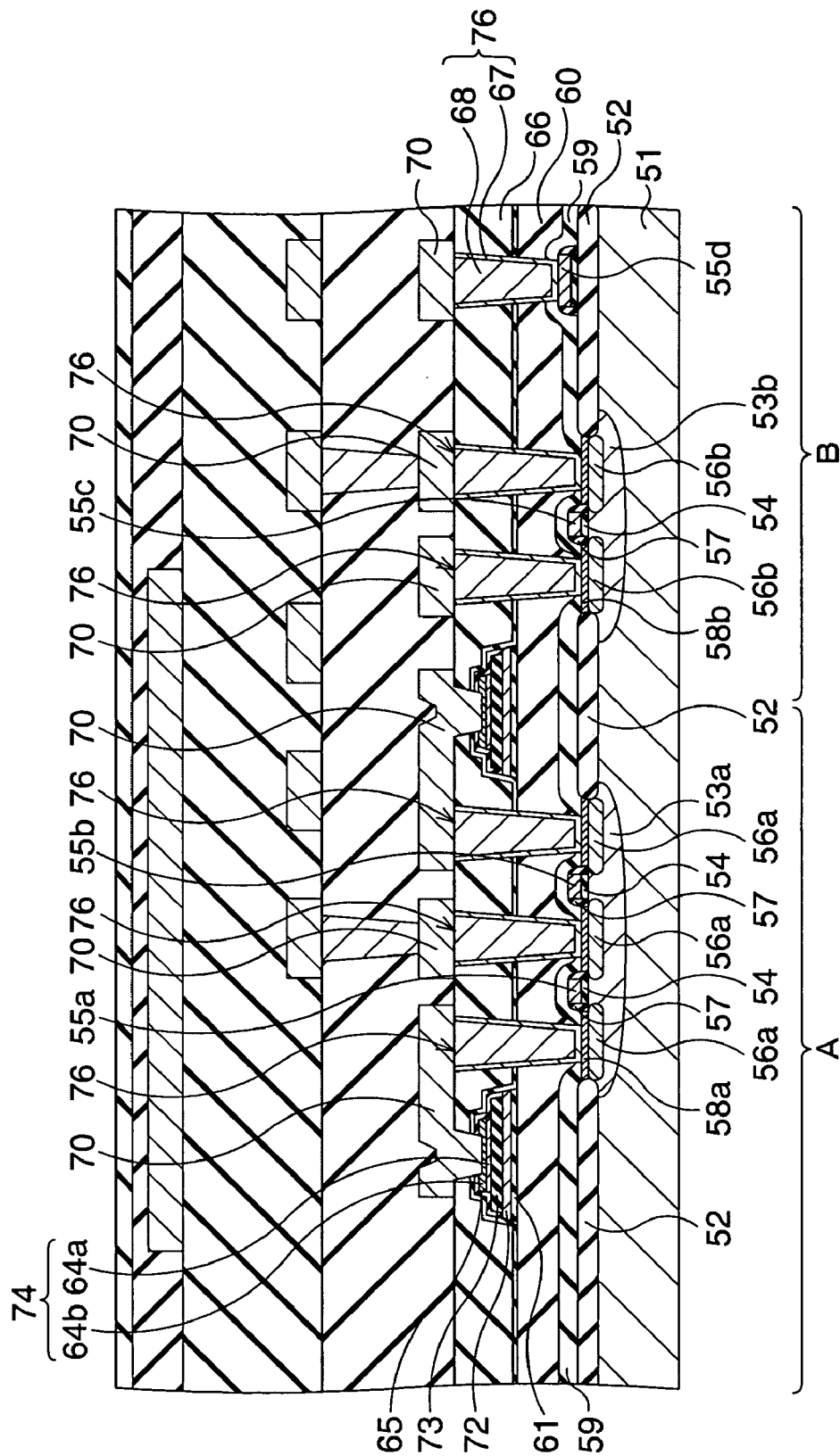

A clean surface is exposed by etching the overall surface by about 10 nm ($SiO_2$ conversion) by an RF etching method. Then, a conductive film having a quadruple-layered structure containing, for example, an aluminum layer is formed on the overall surface by a sputtering method. As the conductive film, a film in which, for example, a titanium nitride film of a thickness of 150 nm, a copper-containing (0.5 weight %) aluminum film of a thickness of 550 nm, a titanium film of a thickness of 5 nm, and a titanium nitride film of a thickness of 150 nm are layered in sequence from the bottom is formed. Wirings 70 are formed by patterning the conductive film by a photolithography method as shown in FIG. 2Q.

Thereafter, as shown in FIG. 2R, an interlayer insulating film is formed, contact plugs are formed and wirings in the second layer from the bottom and thereafter are formed. Then, a cover film constituted of, for example, the TEOS oxide film and the SiN film is formed to complete the ferroelectric memory having the ferroelectric capacitors.

According to the first embodiment as described above, the furnace annealing for the PLZT film 63 is performed in a state in which the PLZT film 63 is completely covered with the $IrO_x$ film 64a, and therefore diffusion and desorption of Pb in the PLZT film 63 are prevented on the annealing. As a result, the fatigue characteristics are improved.

Here, experiments which the inventors of the present application conducted will be explained. In this experiment, first RTA was conducted at 585° C. for 90 seconds under the condition of temperature increasing speed: 125° C./sec, atmosphere: $O_2$; 2.5%/Ar; 97.5%, after a Pt film of a thickness of 150 nm and a PLZT film of a thickness of 150 nm were sequentially formed by a sputtering method. Next, the $IrO_{1.4}$ film of a thickness of 50 nm was formed as a first conductive oxide film by a reactive sputtering. Then, second RTA was performed at 725° C. for 20 seconds under the condition of temperature increasing speed: 125° C./sec, atmosphere: $O_2$; 1%/Ar; 99%. Thereafter, the $IrO_2$ film of a thickness of 200 nm was formed as a second conductive oxide film by a reactive sputtering. Then, an upper electrode with a plan shape of 50 by 50 µm square was formed by performing photo etching for the $IrO_2$ film and the $IrO_{1.4}$ film. Further, furnace annealing was performed at various temperatures (550° C., 600° C., 650° C., and 700° C.). The furnace annealing was performed for 60 minutes in an oxygen atmosphere. Thereafter, the PLZT film was etched. Another sample was thus produced. The sample without the furnace annealing was also produced. The quantities of switching electric charge of these samples were measured. The result is shown in FIG. 4.

Other samples were produced by performing the furnace annealing after the second RTA instead of after the patterning of the upper electrode film, and the quantity of switching charge of the samples was measured. The result is shown in FIG. 5. FIG. 5 also shows part of the result shown in FIG. 4 for comparison.

As shown in FIG. 4, the sample for which only the RTA was performed had a quantity of 3V switching electric charge (Qsw@3V) of the ferroelectric capacitor of about 5 µC/cm², which is very small. The PLZT film is formed by performing an RF sputtering with only Ar gas by using a PLZT sintered target, and therefore it is presumed that a large quantity of oxygen deficiency exists in the PLZT film. Further, it is considered that physical damage has been given to the PLZT film when sputtering was performed for the $IrO_{1.4}$ film. Though the RTA was performed to recover the oxygen deficiency, but the result shown in FIG. 4 shows that only the RTA is insufficient to recover the oxygen deficiency in the PLZT film.

Consequently, furnace annealing for a comparatively long time to recover the oxygen deficiency, namely, to restore the ferroelectricity is needed. As shown in FIG. 4, the quantity of switching electric charge (Qsw@3V) becomes larger as temperature of the furnace annealing is higher, and the characteristics of the ferroelectric capacitor are restored more.

However, since in the conventional manufacturing method (comparison example) of which result is shown in FIG. 4, the furnace annealing is performed after patterning of the ferroelectric film, dislocation of the Pb in the PLZT from the peripheral area of the upper electrode occurs, and the characteristics of the ferroelectric capacitor, more specifically, the fatigue characteristics deteriorate. Oxygen diffuses in the lateral direction of the ferroelectric film from the peripheral area of the upper electrode, and therefore there exists a problem that a restored state of the ferroelectric capacitor differs in accordance with the upper electrode.

Further, in a next-generation ferroelectric memory, a ferroelectric film formed by an MOCVD method is desired. This is because it is difficult to obtain the sufficient characteristics from the film formed by the conventional sputtering method, and a more precise film is demanded. In addition, in a 0.18 µm-generation ferroelectric memory, the stack capacitor structure is adopted to enhance integration density, and etching at once to realize a substantially high integration becomes essential. For this reason, a process which is enabled after only the upper electrode is etched becomes impossible. If the furnace annealing is performed after etching at once, Pb dislocation occurs from the peripheral area of the ferroelectric film pattern, and therefore fatigue characteristics deteriorate more sharply.

On the other hand, according to this embodiment, such Pb dislocation does not occur, and therefore deterioration of the fatigue characteristics is prevented. The efficiency of recovering of the oxygen deficiency is more enhanced than in the conventional method in which it is performed via the thick upper electrode (50 nm+200 nm), because oxygen is supplied to the PLZT film via the comparatively thin $IrO_{1.4}$ film (50 nm). Consequently, the larger quantity of switching electric charge is obtained as shown in FIG. 5.

Figure 6:
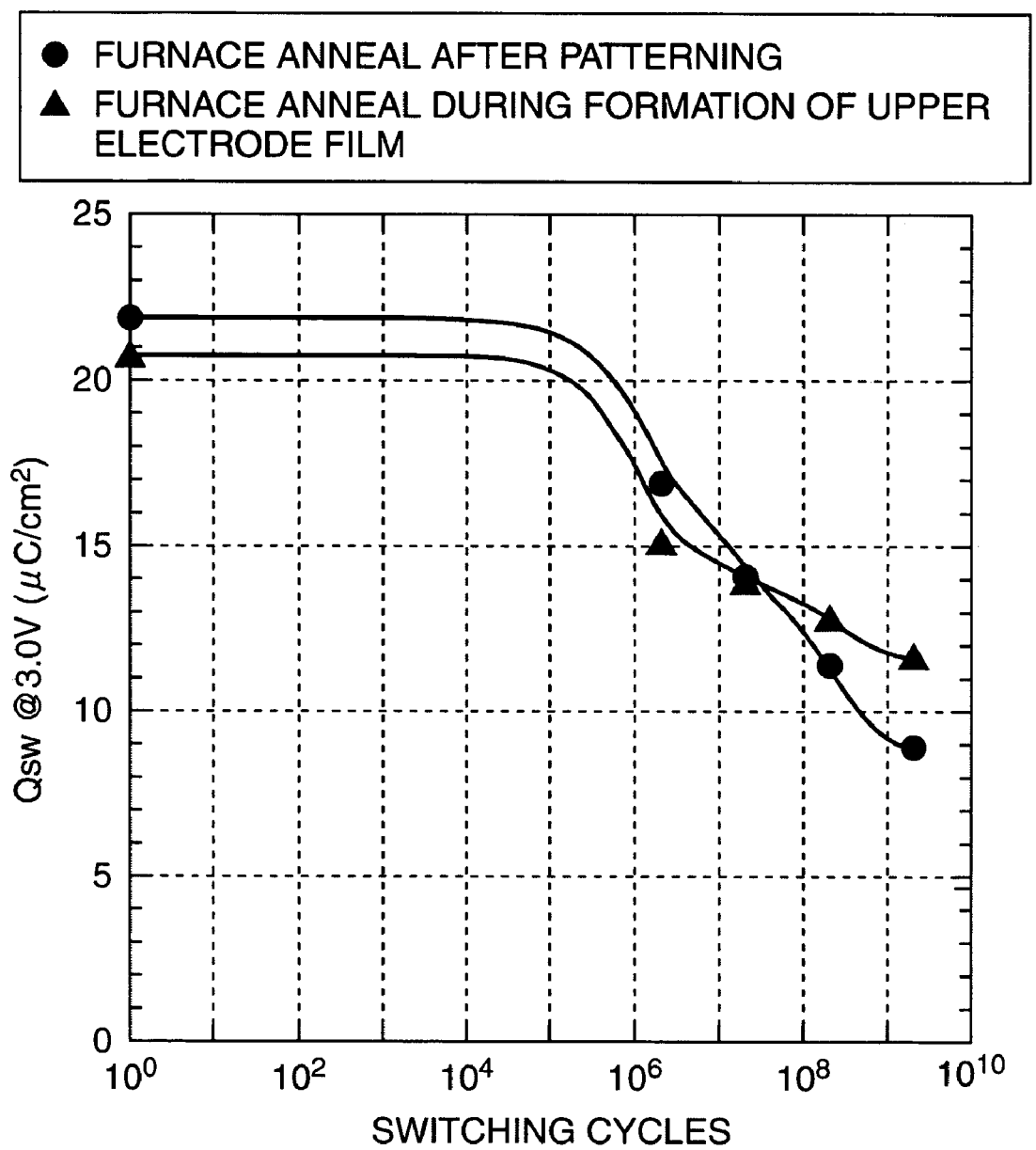
FIG. 6 is a graph showing a change of fatigue characteristics.

The inventors of the present application further conducted experiments relating to the fatigue characteristics. Temperature in furnace annealing was set at 650° C. The result is shown in FIG. 6. As shown in FIG. 6, the quantity of the switching electric charge of 3V (Qsw@3V) after fatigued became larger in the sample for which the furnace annealing was performed during formation of the upper electrode according to the first embodiment than in the sample for which the furnace annealing was performed after the patterning of the upper electrode. Namely, the former had more favorable fatigue characteristics. This is because the Pb dislocation was prevented as described above. In this fatigue test, evaluation was performed with acceleration, and therefore the applied voltage was set at 7V.

As shown in FIG. 5, in the sample (X) for which the furnace annealing was performed at 550° C. during the formation of the upper electrode, the distribution of the quantity of the switching electric charge Qsw in the wafer surface was large. When it was examined in detail with mapping (not shown) within the wafer surface, the degree of the restoration of the quantity of the switching electric charge Qsw was low at the wafer center portion. This suggests that the quantity of oxygen deficiency in the PLZT film at the wafer center portion is originally large. Accordingly, in order to obtain a favorable quantity of the switching electric charge Qsw in all over the wafer surface, it is preferable to perform the furnace annealing at a temperature of 600° or higher, and it is more preferable to perform the furnace annealing at a temperature of 650° C. or higher.

As these experimental results indicate, the problem of the pattern dependency occurring when the furnace annealing is performed after the patterning of the upper electrode film (the problem that oxygen diffuses in the lateral direction from the peripheral area of the upper electrode) is solved according to this embodiment. When etching at once is performed, the furnace annealing is performed before the etching at once, and therefore the Pb dislocation of the PZT constituting the ferroelectric film does not occur, thus making it possible to prevent deterioration of the fatigue characteristics.

Second Embodiment

Next, a second embodiment of the present invention will be explained. FIG. 3A to FIG. 3G are sectional views showing a manufacturing method of a ferroelectric memory (semiconductor device) according to the second embodiment of the present invention in the sequence of the process steps.

Figure 3A:
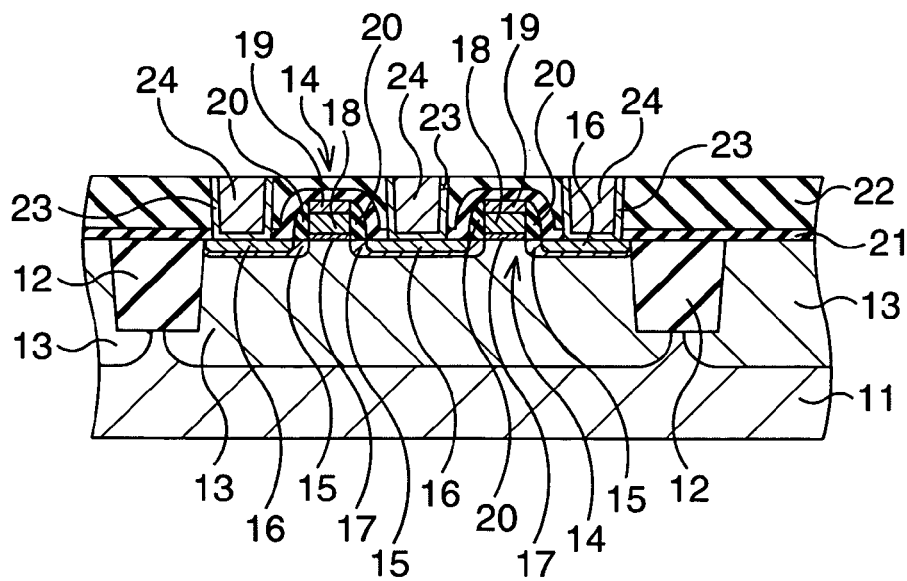
FIGS. 3A to 3G are sectional views showing a manufacturing method of a ferroelectric memory according to a second embodiment of the present invention in sequence of the process steps.

First, as shown in FIG. 3A, device isolation regions 12 are formed on a surface of a semiconductor substrate 11 such as a silicon substrate by, for example, STI (shallow trench isolation). Next, in a device active region which is partitioned by the device isolation regions 12, a well 13 is formed on the surface of the semiconductor substrate 11. Subsequently, a gate insulating film 17, a gate electrode 18, a silicide layer 19, source/drain diffusion layers 15, side walls 20 and silicide layers 16 are formed on a surface of the well 13, whereby a MOS transistor 14 is formed. The MOS transistor 14 corresponds to the MOS transistor 2 in FIG. 1. Two source/drain diffusion layers 15 are formed in each MOS transistor 14, and the one of them is shared by the two MOS transistors 14.

Next, a silicon oxide nitride film 21 is formed on the overall surface to cover the MOS transistor 14, and further, a silicon oxide film 22 is formed on the overall surface by, for example, an organic CVD method. The silicon oxide nitride film 21 is formed to prevent hydrogen degradation of the gate insulating film 17 and the like when the silicon oxide film 22 is formed. Thereafter, contact holes reaching the silicide layers 16 are formed in the silicon oxide film 22 and the silicon oxide nitride film 21, whereby plug contact portions are opened. Then, after laminated films each constituted of a TiN film of 50 nm and a Ti film of 30 nm are formed as glue films 23 in the contact holes, W films are buried by, for example, a CVD method, and are planarized by performing CMP (chemical mechanical polishing), whereby W-plugs 24 are formed.

After the planarization is finished, the surface of the silicon oxide film 22 (interlayer insulating film) is improved with plasma using an $NH_3$ gas. Since the ratio of the area of the W-plugs 24 to the area of the ferroelectric capacitor which is formed later is about 10% and low, the improvement of the silicon oxide film 22, which is the interlayer insulating film, leads to the improvement in crystallinity of the ferroelectric film constituting the ferroelectric capacitor, and as a result, the quantity of the switching electric charge Qsw increases. The conditions of the $NH_3$ plasma treatment is, for example, flow rate of $NH_3$: 350 sccm, pressure: 266.64 Pa (2 Torr), power: HF 100 W/LF 55 W, and time: 60 seconds. The frequency of HF is 13.56 MHz, and the frequency of LF is 300 kHz.

Figure 3B:
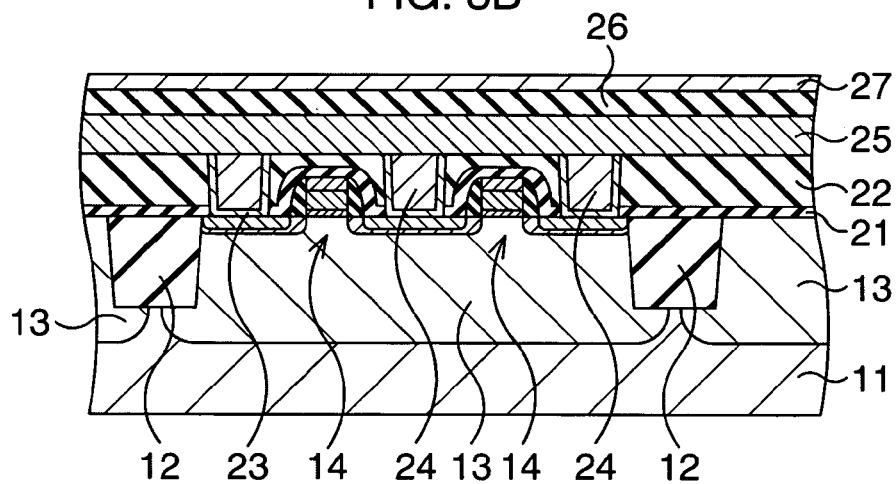

Next, as shown in FIG. 3B, a lower electrode film 25, a ferroelectric film 26 and an upper electrode film 27 are formed in sequence on the overall surface.

Upon forming the lower electrode film 25, for example, a Ti film of a thickness of 10 nm and an Ir film of a thickness of 150 nm are formed in sequence by a sputtering method under conditions shown in the following Table 1.

TABLE 1

|  | Ar GAS PRESSURE | DC POWER | TIME | TEMPERATURE |
| --- | --- | --- | --- | --- |
| Ti FILM | 0.15 Pa | 2.6 kw | 7 SECONDS | 30° C. |
| Ir FILM | 0.8 Pa | 0.3 kw | 360 SECONDS | 500° C. |

For example, a PZT film can be formed by a MOCVD method as the ferroelectric film 26, and its thickness is, for example, 120 nm. One example of conditions is as in the following Table 2.

TABLE 2

| FILM FORMING PRESSURE | 667 Pa (5 Torr) |
| --- | --- |
| FILM FORMING TEMPERATURE | 620° C. |
| TIME | 620 SECONDS |

It is preferable to use a carburetor in the MOCVD method for forming the ferroelectric film 26. Then, each of solid raw materials of Pb, Zr and Ti is dissolved in an organic compound solution, and the solution, in which the solid raw materials are dissolved, is vaporized to generate a raw material gas, then the raw material gas is introduced into a reaction container, and an oxygen gas is supplied from another line to form the PZT film. One example of the raw materials and its flow rates at the time of forming the PZT film is shown in the following Table 3.

TABLE 3

| SOLVENT | THF (TETRA HYDRO FURAN: $C_4H_8O$) | 0.474 ml/min. |
| --- | --- | --- |
| RAW MATERIAL | Pb $(DPM)_2$ (CONCENTRATION: $0.3 \times 10^3$ mol/m$^3$, DISSOLVED IN THF SOLUTION) | 0.326 ml/min. |
|  | Zr $(dmhd)_4$ (CONCENTRATION: $0.3 \times 10^3$ mol/m$^3$, DISSOLVED IN THF SOLUTION) | 0.200 ml/min. |
|  | Ti $(O\text{-}iPr)_2(DPM)_2$ (CONCENTRATION: $0.3 \times 10^3$ mol/m$^3$, DISSOLVED IN THF SOLUTION) | 0.200 ml/min. |

Upon forming the upper electrode 27, annealing inside a furnace is performed after an $IrO_x$ film is formed, and thereafter an $IrO_2$ film is formed. The $IrO_x$ film is formed by, for example, a sputtering method, and one example of conditions is as in the following Table 4.

TABLE 4

| Ar GAS FLOW RATE | 100 sccm |
| --- | --- |
| $O_2$ GAS FLOW RATE | 56 sccm |
| DC POWER | 2.0 Kw |
| TIME | 10 SECONDS |

The annealing performed after the $IrO_x$ film is formed is recovering annealing to recover the damage of the ferroelectric film 26 due to formation of the $IrO_x$ film. As the recovering annealing, furnace annealing is carried out at, for example, 550° C. in the $O_2$ atmosphere for 60 minutes. When the PZT film is formed by the MOCVD method, the film is formed in the O₂ atmosphere unlike the sputtering method. Therefore, the recovering annealing at 600° C. or higher is not always needed, and the damage is sufficiently recovered by the annealing at 550° C. In this case, it is preferable to perform RTA before the furnace annealing as in the first embodiment. For forming the IrO₂ film after the furnace annealing, for example, a sputtering method is adopted, and one example of conditions is as in the following Table 5.

TABLE 5

| Ar GAS FLOW RATE | 100 sccm |
|---|---|
| O₂ GAS FLOW RATE | 100 sccm |
| DC POWER | 1.0 kW |
| TIME | 79 seconds |

Figure 3C:
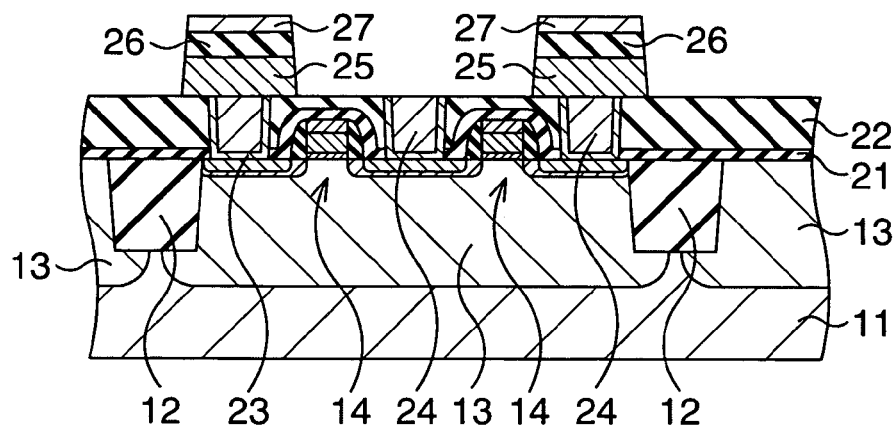

Subsequently, as shown in FIG. 3C, the upper electrode film 27, the ferroelectric film 26 and the lower electrode film 25 are processed with patterning and etching techniques, thereby forming a ferroelectric capacitor with a stacked structure, in which the upper electrode film 27 is an upper electrode, the lower electrode film 25 is a lower electrode, and the ferroelectric film 26 are sandwiched between the upper and lower electrodes. The ferroelectric capacitor corresponds to the ferroelectric capacitor 1 in FIG. 1. In the processing, the upper electrode film 27, the ferroelectric film 26 and the lower electrode film 25 are etched at one time using, for example, a laminated film (not shown) of a plasma TEOS (tetraethyl orthosilicate) film and a TiN film as a hard mask.

Figure 3D:
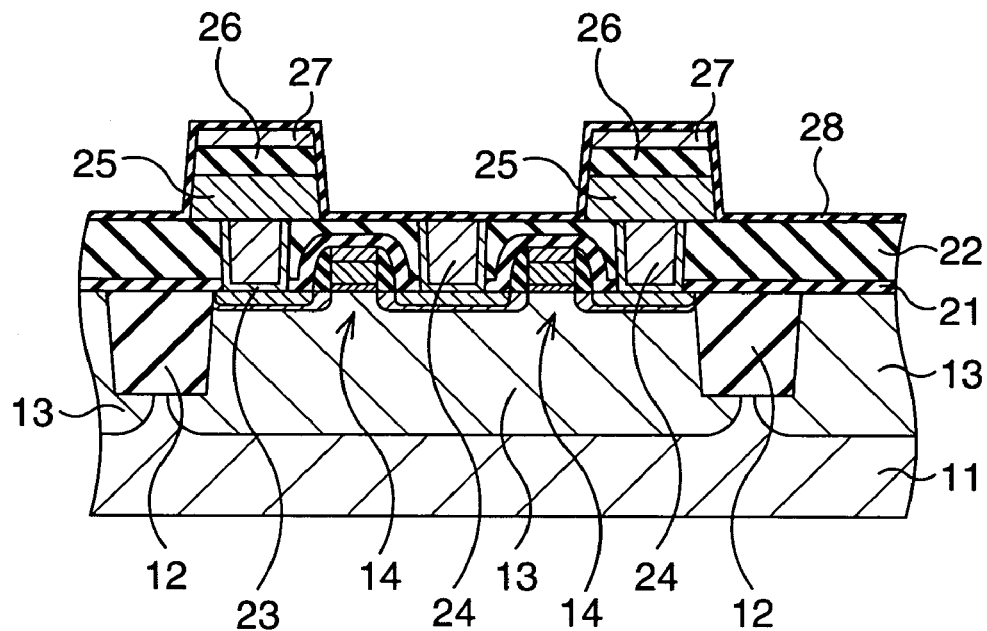

Next, as shown in FIG. 3D, an alumina protection film 28 to cover the ferroelectric capacitor is formed on the overall surface. The alumina protection film 28 is formed by, for example, a CVD method, and the thickness is, for example, 5 to 20 nm, 10 nm in the present embodiment. Step coverage of the alumina protection film 28 is favorable. Subsequently, etching damage occurring to the ferroelectric film 26 is recovered by carrying out furnace annealing at 550° C. in an O₂ atmosphere for 60 minutes.

Figure 3E:
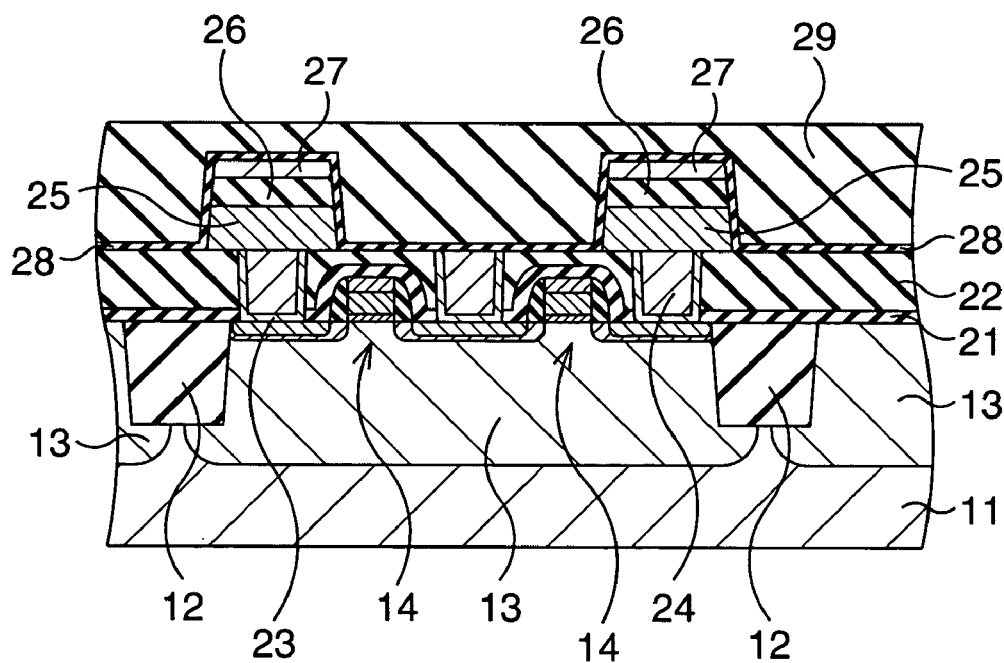

Next, as shown in FIG. 3E, an interlayer insulating film 29 is formed on the overall surface, and thereafter, it is planarized by CMP. The silicon oxide film is formed with using, for example, an HDP (High Density Plasma) CVD device. The thickness of the left film after the CMP is, for example, 400 nm on the upper electrode 27.

Figure 3F:
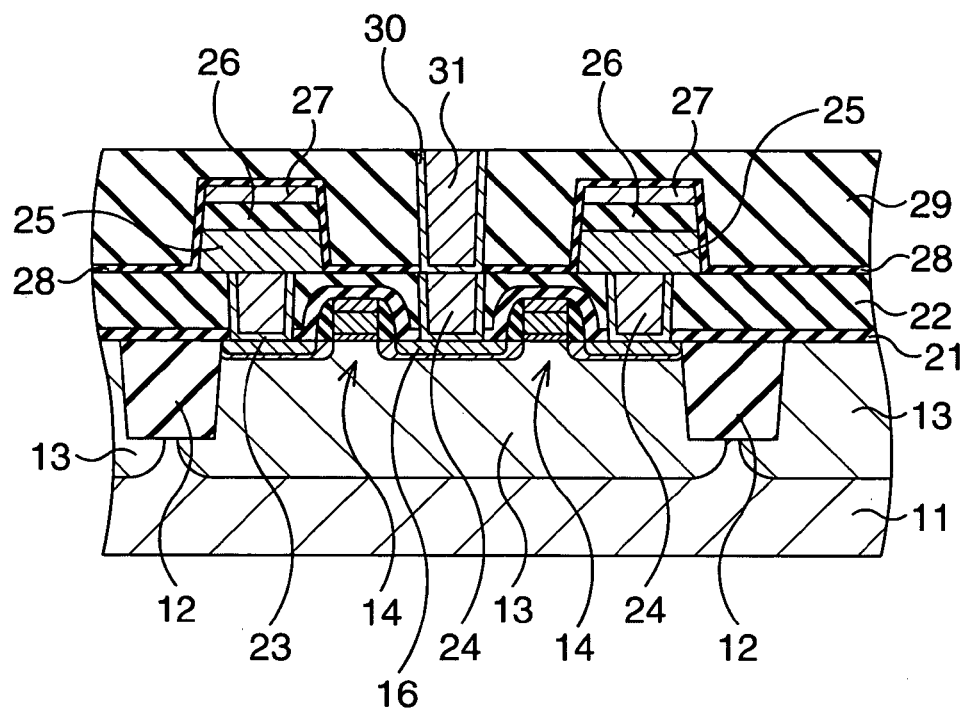

Subsequently, as shown in FIG. 3F, a contact hole reaching the W-plug 24 connected to the silicide layer 16 shared by the two MOS transistors 14 is formed in the interlayer insulating film 29 and the alumina protection film 28 with patterning and etching techniques. Next, after a TiN film of a thickness of, for example, 50 nm is formed as a glue film 30 inside the contact hole, a W-film is embedded by, for example, a CVD method, and a W-plug 31 is formed by planarizing the W-film by carrying out CMP (chemical mechanical polishing). Thereafter, the surfaces of the interlayer insulating film 29 and the W-plug 31 are exposed to an N₂ plasma at, for example, 350° C. The time for the plasma treatment is, for example, about 120 seconds. Via to via contact is realized by the W-plug 31 and the W-plug 24, which is formed under the W-plug 31.

Figure 3G:
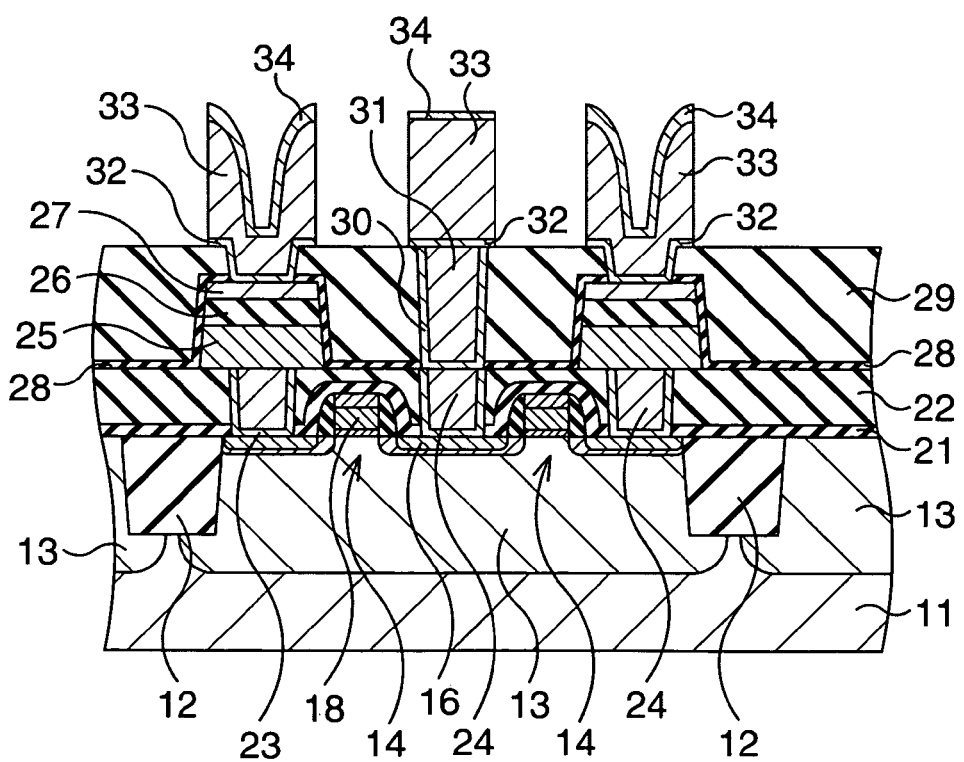

Next, a W-oxidation inhibiting film (not shown) is formed on the overall surface. For example, a SiON film can be used as the W-oxidation inhibiting film, and its thickness is, for example, about 100 nm. Contact holes reaching the upper electrode film 27 are formed in the W-oxidation inhibiting film and the interlayer insulating film 29 with patterning and etching techniques as shown in FIG. 3G. Subsequently, annealing for recovering damage by hydrogen and damage by the etching during deposition of the interlayer insulating film 29 is performed. The annealing may be the furnace annealing at, for example, 550° C. in an O₂ atmosphere, and time for it is, for example, 60 minutes. After the annealing, the W-oxidation inhibiting film is removed by etching back.

Next, a glue film, a wiring material film and a glue film are deposited in sequence. For example, a laminated film of a TiN film of a thickness of 70 nm and a Ti film of a thickness of 5 nm may be formed as the lower glue film, and for example, an Al—Cu alloy film of a thickness of 400 nm may be formed as the wiring material film. For example, a laminated film of a TiN film of a thickness of 30 nm and a Ti film of 60 nm may be formed as the upper glue film.

Next, a reflection preventing film (not shown) is formed on the upper glue film by coating, and resist is further applied thereon. Subsequently, the resist film is processed to conform to a wiring pattern, and the reflection preventing film, the upper glue film, the wiring material film and the lower glue film are etched with the processed resist film as a mask. For example, a SiON film can be used as the reflection preventing film, and the thickness is, for example, about 30 nm. Glue films 32, wirings 33 and glue films 34 are formed by the above-described etching shown in FIG. 3G.

Thereafter, an interlayer insulating film is formed, a contact plug is formed, wirings of the second layer and thereafter are formed. Then, the ferroelectric memory having the ferroelectric capacitor is completed by forming a cover film constituted of, for example, a TEOS oxide film and a SiN film. On forming the upper layer wirings, the wirings 33 connected to the upper electrodes 27 may be connected to a plate line, the wiring 33 connected to the silicide layer 16 shared by the two MOS transistors 14 may be connected to a bit line. The gate electrode 18 itself may be made a word line, and the gate electrode 18 may be connected to a word line in the upper layer wirings.

In the second embodiment described above, etching at once is performed for the upper electrode film 27, the ferroelectric film 26 and the lower electric film 25, but the furnace annealing is performed during the formation of the IrO$_x$ film and the IrO₂ film constituting the upper electrode film 27, and therefore it is possible to avoid Pb dislocation accompanying the furnace annealing.

In the present embodiment, the wiring 33 is connected to the silicide layer 16 via the via-to-via contact constituted of the W-plugs 31 and 24. Since a larger step exists for the ferroelectric capacitor in the ferroelectric memory as compared with a normal logic product, an aspect ratio of the contact to the substrate (or the diffusion layer formed on its surface) from the wiring 33 in the lowermost layer is large. If the contact hole is to be made by etching at once as in the prior art to form the contact, the etching itself is difficult. It is also difficult to form a glue film. Accordingly, new equipment suitable to make such a contact hole and form a glue film is required. On the other hand, when the via-to-via contact is formed, the etching and the formation of the glue film are comparatively easy, therefore making it possible to increase yield of the ferroelectric memory and use the conventional apparatus as it is. Accordingly, it is possible to reduce the development cost and the process cost.

As explained thus far, according to these embodiments, Pb dislocation from the ferroelectric film can be restrained, and the ferroelectric capacitor excellent in the fatigue characteristics can be obtained. Even when the upper electrode film, the ferroelectric film and the lower electric film are etched at one time after the ferroelectric film is formed by the MOCVD method, it becomes possible to recover oxygen deficiency by performing the furnace annealing, and therefore the ferroelectric capacitor having high reliability can be obtained. Accordingly, it is possible to respond to miniaturization of the ferroelectric memory sufficiently.

It is possible to use the PZT film and the like other than the PLZT film as the ferroelectric film.

According to the present invention, the furnace annealing is performed in the atmosphere containing oxygen between the formation of the first conductive oxide film and the formation of the second conductive oxide film, and therefore oxygen deficiency can be recovered sufficiently. Accordingly, large quantity of switching electric charge can be obtained. Since the ferroelectric film is completely covered with the first conductive oxide film on the furnace annealing, the component of the ferroelectric film, for example, Pb in the case in which the ferroelectric film is constituted of PZT is not evaporated, and thus the fatigue characteristics do not deteriorate.

Further, in the present invention, the upper electrode of the ferroelectric capacitor is formed by the first and the second conductive oxide films, but the furnace annealing is performed before the second conductive oxide film is formed. Therefore, oxygen is ready to diffuse to the ferroelectric film, and the ferroelectric characteristics can be more efficiently restored.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A manufacturing method of a semiconductor device, comprising the steps of:
    forming a conductive film;
    forming a ferroelectric film on the conductive film;
    forming a first conductive oxide film on the ferroelectric film, wherein the first conductive oxide film is formed under a condition of lower oxidation than when the second conductive oxide film is formed;
    performing furnace annealing for the ferroelectric film in an atmosphere containing oxygen, after forming the first conductive oxide film; and
    thereafter forming a second conductive oxide film on the first conductive oxide film.

2. The manufacturing method of the semiconductor device according to claim 1, wherein the ferroelectric film is formed by an MOCVD (Metal Organic Chemical Vapor Deposition) method.

3. The manufacturing method of the semiconductor device according to claim 1, further comprising the step of performing annealing for the ferroelectric film in an atmosphere containing oxygen, between said step of forming the ferroelectric film and said step of forming the first conductive oxide film.

4. The manufacturing method of the semiconductor device according to claim 3, wherein the ferroelectric film is formed by a sputtering method.

5. The manufacturing method of the semiconductor device according to claim 3, wherein the annealing between said step of forming the ferroelectric film and said step of forming the first conductive oxide film is performed under a condition that partial pressure of oxygen is less than 10% of atmospheric pressure.

6. The manufacturing method of the semiconductor device according to claim 1, further comprising the step of performing annealing for the ferroelectric film in an atmosphere containing oxygen, between said step of forming the first conductive oxide film and said step of performing the furnace annealing.

7. The manufacturing method of the semiconductor device according to claim 6, wherein the annealing between said step of forming the first conductive oxide film and said step of performing the furnace annealing is performed under a condition that partial pressure of oxygen is less than 5% of atmospheric pressure.

8. The manufacturing method of the semiconductor device according to claim 1, wherein an oxide film containing lead, zirconium and titanium is formed as the ferroelectric film.

9. The manufacturing method of the semiconductor device according to claim 1, wherein the furnace annealing for the ferroelectric film is performed under a condition of a temperature of 600° C. or higher.

10. The manufacturing method of the semiconductor device according to claim 1, wherein iridium oxide films are formed as the first and the second conductive oxide films.

11. The manufacturing method of the semiconductor device according to claim 10, wherein an $IrO_x$ (iridium oxide) film ($1<x<2$) is formed as the first conductive oxide film, and an $IrO_2$ (iridium dioxide) film is formed as the second conductive oxide film.

12. The manufacturing method of the semiconductor device according to claim 1, wherein the first and the second conductive oxide films are formed by a reactive sputtering method.

13. The manufacturing method of the semiconductor device according to claim 1, further comprising the step of forming a ferroelectric capacitor by patterning the second conductive oxide film, the first conductive oxide film, the ferroelectric film and the conductive film at one time.

14. The manufacturing method of the semiconductor device according to claim 1, further comprising the step of forming a ferroelectric capacitor by patterning the second conductive oxide film, the first conductive oxide film, the ferroelectric film and the conductive film in sequence.

15. The manufacturing method of the semiconductor device according to claim 1, wherein thickness of the first conductive oxide film is set to be 20 nm to 75 nm.

16. The manufacturing method of the semiconductor device according to claim 1, wherein thickness of the second conductive oxide film is set to be 100 nm to 300 nm.

* * * * *

UNITED STATES PATENT AND TRADEMARK OFFICE
CERTIFICATE OF CORRECTION

PATENT NO. : 7,078,242 B2 Page 1 of 1
APPLICATION NO. : 10/835572
DATED : July 18, 2006
INVENTOR(S) : Katsuyoshi Matsuura et al.

It is certified that error appears in the above-identified patent and that said Letters Patent is hereby corrected as shown below:

On the Title Page, Item (54); Title

Please correct the Title which should read,

-- MANUFACTURING METHOD OF SEMICONDUCTOR DEVICE --.

Signed and Sealed this

Sixth Day of March, 2007

JON W. DUDAS
*Director of the United States Patent and Trademark Office*